United States Patent
Hazeghi et al.

(10) Patent No.: US 10,650,588 B2
(45) Date of Patent: May 12, 2020

(54) SYSTEM AND METHOD FOR PORTABLE ACTIVE 3D SCANNING

(71) Applicant: AQUIFI, INC., Palo Alto, CA (US)

(72) Inventors: Aryan Hazeghi, Palo Alto, CA (US); Giuliano Pasqualotto, Mountain View, CA (US); Keith Blackstone, Pacifica, CA (US); Carlo Dal Mutto, Sunnyvale, CA (US); Abbas Rafii, Palo Alto, CA (US); Jason Trachewsky, Menlo Park, CA (US); Jackson Masters, Redwood City, CA (US)

(73) Assignee: Aquifi, Inc., Palo Alto, CA (US)

( * ) Notice: Subject to any disclaimer, the term of this patent is extended or adjusted under 35 U.S.C. 154(b) by 0 days.

(21) Appl. No.: 16/213,739

(22) Filed: Dec. 7, 2018

(65) Prior Publication Data

US 2019/0108678 A1 Apr. 11, 2019

Related U.S. Application Data

(63) Continuation of application No. 15/805,107, filed on Nov. 6, 2017, now Pat. No. 10,204,448.
(Continued)

(51) Int. Cl.
*G06T 17/20* (2006.01)
*H05K 7/20* (2006.01)
(Continued)

(52) U.S. Cl.
CPC .............. *G06T 17/20* (2013.01); *G03B 17/55* (2013.01); *H04N 5/2252* (2013.01); *H04N 5/33* (2013.01); *H04N 9/07* (2013.01); *H04N 13/239* (2018.05); *H04N 13/243* (2018.05); *H04N 13/246* (2018.05); *H04N 13/254* (2018.05);
(Continued)

(58) Field of Classification Search
None
See application file for complete search history.

(56) References Cited

U.S. PATENT DOCUMENTS 6,542,235 B1 4/2003 Caskey et al.
6,542,249 B1 4/2003 Kofman et al.
(Continued)

OTHER PUBLICATIONS

International Search Report and Written Opinion dated Jan. 18, 2018, for corresponding PCT Application No. PCT/US17/60254 (13 pages).
(Continued)

*Primary Examiner* — Michelle Chin
(74) *Attorney, Agent, or Firm* — Lewis Roca Rothgerber Christie LLP

(57) ABSTRACT

A method for generating a three-dimensional model of an object, by a scanning system including a client-side device including: an acquisition system configured to capture images; and an interaction system including a display device and a network interface includes: capturing a plurality of images of the object by the acquisition system, the images being captured from a plurality of different poses of the acquisition system; computing depth maps from the images of the objects, each of the depth maps corresponding to one of the poses of the acquisition system; combining the depth maps to generate a combined point cloud; and displaying, on the display device, the combined point cloud or a 3D mesh model generated from the combined point cloud.

20 Claims, 16 Drawing Sheets
(12 of 16 Drawing Sheet(s) Filed in Color)

Related U.S. Application Data

(60) Provisional application No. 62/417,732, filed on Nov. 4, 2016.

(51) Int. Cl.
  *H04N 13/239* (2018.01)
  *H04N 13/243* (2018.01)
  *H04N 13/246* (2018.01)
  *H04N 13/254* (2018.01)
  *H04N 13/271* (2018.01)
  *H04N 9/07* (2006.01)
  *H04N 5/33* (2006.01)
  *H04N 5/225* (2006.01)
  *G03B 17/55* (2006.01)
  *H04N 13/00* (2018.01)
  *G03B 17/56* (2006.01)

(52) U.S. Cl.
  CPC ....... *H04N 13/271* (2018.05); *H05K 7/20409* (2013.01); *G03B 17/563* (2013.01); *H04N 2013/0077* (2013.01); *H04N 2013/0081* (2013.01)

(56) References Cited

U.S. PATENT DOCUMENTS

| | | | |
|---|---|---|---|
| 8,625,854 | B2 | 1/2014 | Valkenburg et al. |
| 8,705,893 | B1 | 4/2014 | Zhang et al. |
| 9,102,055 | B1 | 8/2015 | Konolige et al. |
| 9,217,637 | B2 | 12/2015 | Heidemann et al. |
| 2009/0061381 | A1 | 3/2009 | Durbin et al. |
| 2011/0134225 | A1 | 6/2011 | Saint-Pierre et al. |
| 2011/0255775 | A1 | 10/2011 | McNamer et al. |
| 2012/0056982 | A1 | 3/2012 | Katz et al. |
| 2012/0271173 | A1 | 10/2012 | Li |
| 2013/0034305 | A1 | 2/2013 | Jahanshahi et al. |
| 2013/0169748 | A1 | 7/2013 | Corral-Soto |
| 2014/0132729 | A1 | 5/2014 | Foulk et al. |
| 2014/0172363 | A1 | 6/2014 | Deichmann et al. |
| 2015/0009214 | A1 | 1/2015 | Lee et al. |
| 2015/0161818 | A1 | 6/2015 | Komenczi et al. |
| 2015/0212626 | A1 | 7/2015 | Kim et al. |
| 2015/0279118 | A1 | 10/2015 | Dou et al. |
| 2016/0196479 | A1 | 7/2016 | Chertok et al. |
| 2016/0210753 | A1 | 7/2016 | Klusza et al. |
| 2016/0375524 | A1 | 12/2016 | Hsu |
| 2017/0085733 | A1 | 3/2017 | Ilic et al. |

OTHER PUBLICATIONS

Nambi, SN Akshay Uttama, et al. "Performance analysis of data processing architectures for the Smart Grid." *Innovative Smart Grid Technologies Conference Europe* (ISGT—Europe), 2014 IEEE PES. IEEE, 2014 (6 pages).
International Search Report and Written Opinion for corresponding Application No. PCT/US2017/020028, dated May 15, 2017 (10 pages).
International Search Report and Written Opinion dated Jul. 13, 2018 for PCT Application No. PCT/US18/31620 (12 pages).

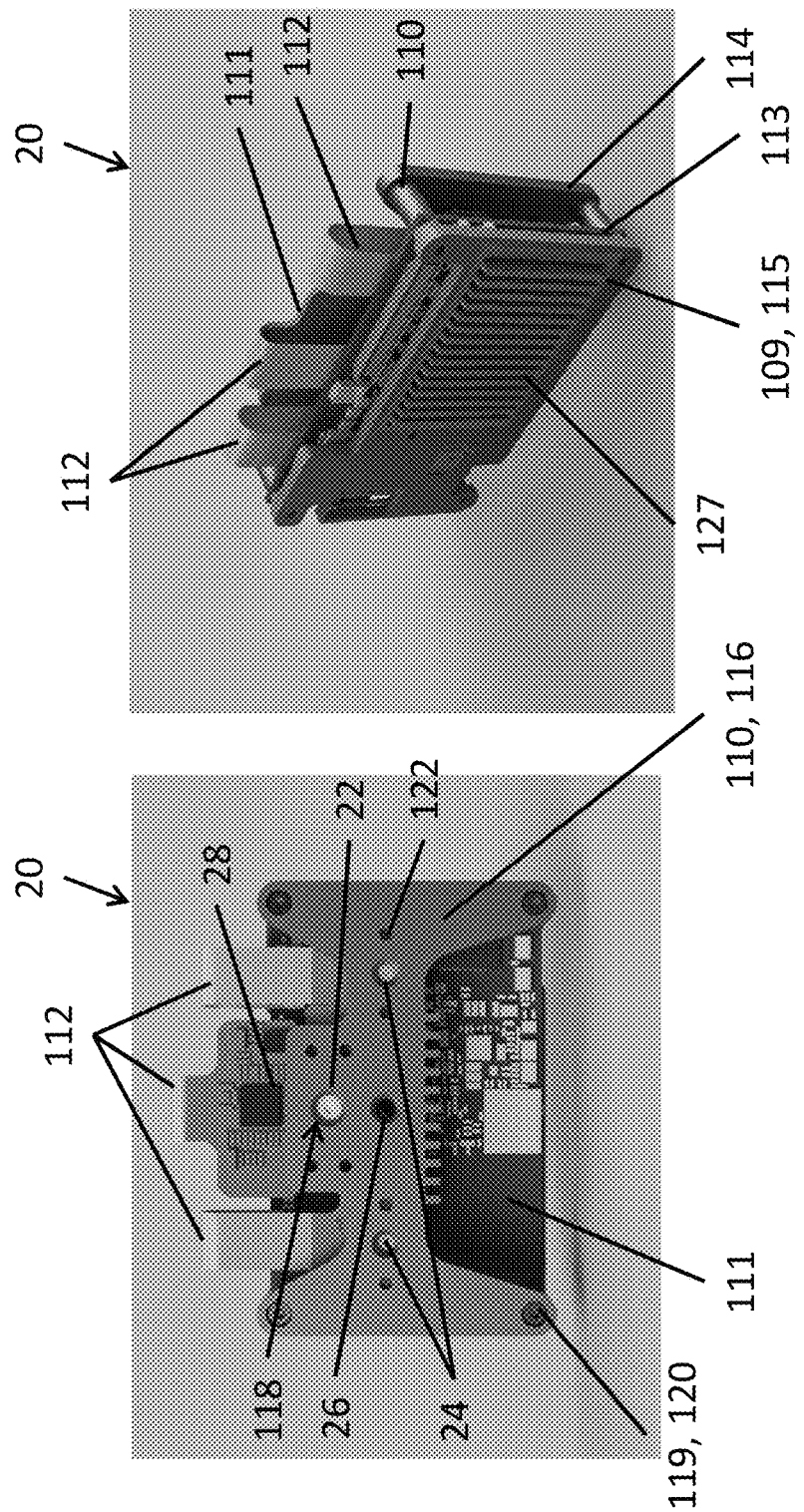

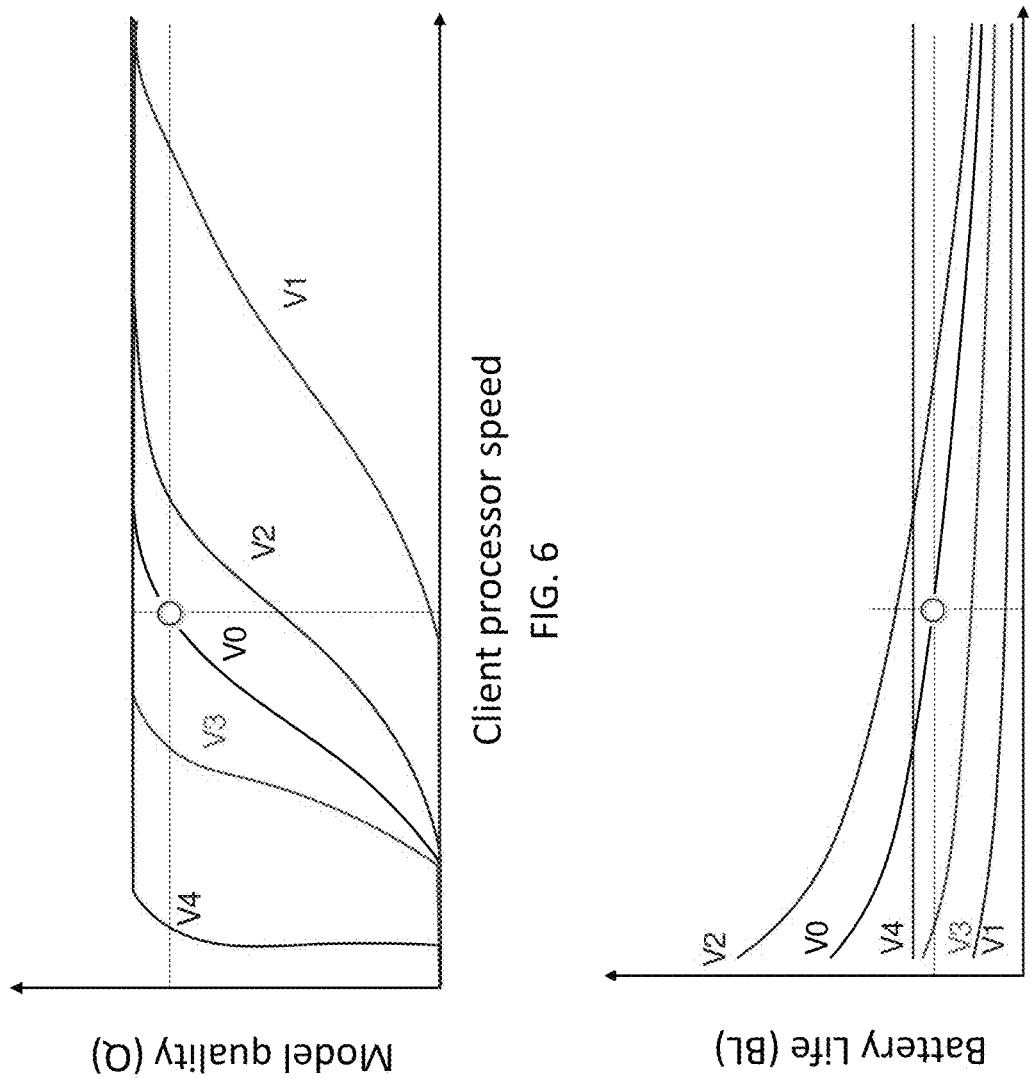

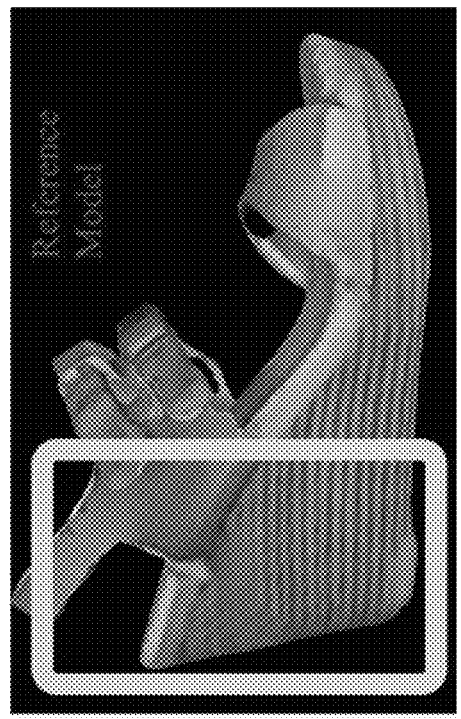
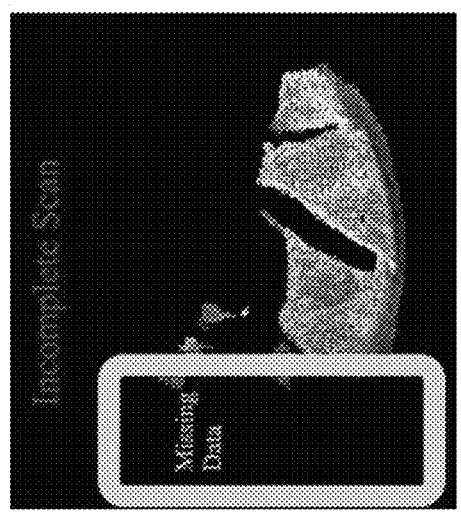
FIG. 8H

SYSTEM AND METHOD FOR PORTABLE ACTIVE 3D SCANNING

CROSS-REFERENCE TO RELATED APPLICATION(S)

This application is a continuation of U.S. patent application Ser. No. 15/805,107, filed Nov. 6, 2017, which claims the benefit of U.S. Provisional Patent Application No. 62/417,732, filed in the United States Patent and Trademark Office on Nov. 4, 2016, the entire disclosures of both of which are incorporated by reference herein.

FIELD

Aspects of embodiments of the present invention relate to the field of three-dimensional scanning systems.

BACKGROUND

Three-dimensional (3D) scanning systems are used to capture 3D models of real-world, physical objects by using one or more 3D scanners to capture views of the physical objects from multiple angles and synthesizing the 3D models from the multiple views.

Three-dimensional scanning systems may be contrasted with panoramic photography or virtual reality (VR) photography that capture a series of two dimensional (2D) images from multiple viewpoints and combine the 2D images into a format that allows a user to control the panning of a virtual camera across a 2D scene that remains stationary at a fixed central point (e.g., "outward facing" VR photography) and formats that allow a user to rotate around an object to view 2D images of the object from different sides (e.g., "inward facing" VR photography).

In contrast, the 3D scanning systems may be used to capture three-dimensional models of objects and/or environments (e.g., geometry defined by collections of three dimensional points), thereby allowing, for example, the measurement of lengths within the 3D models, and the insertion of the captured 3D models into 3D virtual environments such as 3D modeling tools and 3D game engines.

SUMMARY

Aspects of embodiments relate to 3D scanning systems that include portable, handheld 3D scanners. In some embodiments, the 3D scanners include a depth camera for capturing images of the object and a display device that is configured to provide real-time or substantially real-time feedback to the user regarding, for example, the framing of the images captured by the depth camera and the progress of the creation of the 3D models. Some aspects of embodiments of the present invention relate to distributing a computational pipeline for generating 3D models from captured images between a local client device (e.g., the handheld 3D scanner) and a server device (e.g., an offline processing system).

According to one embodiment of the present invention, a method for generating a three-dimensional model of an object, by a scanning system including a client-side device including: an acquisition system configured to capture images; and an interaction system including a display device and a network interface, the method including: capturing a plurality of images of the object by the acquisition system, the images being captured from a plurality of different poses of the acquisition system; computing depth maps from the images of the objects, each of the depth maps corresponding to one of the poses of the acquisition system; combining the depth maps to generate a combined point cloud; and displaying, on the display device, the combined point cloud or a 3D mesh model generated from the combined point cloud.

The scanning system may further include an offline processing system including a processor and memory, wherein the method may further include: computing, by the offline processing system, the 3D mesh model from the combined point cloud; and receiving, by the client side device via the network interface, the 3D mesh model from the offline processing system.

The scanning system may further include an offline processing system including a processor and memory, wherein the computing the depth maps from the images of the objects and the combining the depth maps to generate the combined point cloud may be performed by the client-side device, and wherein the method may further include transmitting the combined point cloud to the offline processing system.

The scanning system may further include an offline processing system including a processor and memory, wherein the computing the depth maps from the images of the objects may be performed by the client-side device, wherein the method may further include transmitting the depth maps from the client-side device to the offline processing system, and wherein the combining the depth maps to generate the combined point cloud may be performed by the offline processing system.

The scanning system may further include an offline processing system including a processor and memory, wherein the method may further include transmitting the plurality of images of the object from the client-side device to the offline processing system via the network interface of the interaction system, and wherein the computing the depth maps from the images of the objects and the combining the depth maps to generate the combined point cloud may be performed by the offline processing system.

The scanning system may further include an offline processing system including a processor and memory, and wherein the computing the depth maps from the images of the objects and the combining the depth maps to generate the combined point cloud may be distributed between the client-side device and the offline processing system in accordance with a plurality of configuration settings.

The configuration settings may be provided in a manifest file, and the configuration settings may be specified in terms of at least one of: model quality, client processing, turn-around time, client battery life, and server processing.

The model quality may include geometric detail and surface texture fidelity, the geometric detail being defined based on number of polygons in the mesh model.

The configuration settings may be dynamically configured in accordance with a plurality of current conditions of the client-side device, the current conditions including power availability and network accessibility.

The method may further include computing, by the client device, a real-time preview of the scan from the images of the objects; and displaying the real time preview on the display device.

The acquisition system may include: a first infrared camera having a first optical axis and a first field of view, a second infrared camera spaced apart from the first infrared camera and having a second optical axis substantially parallel to the first optical axis and a second field of view overlapping the first field of view; a color camera having an optical axis substantially parallel to the first optical axis and the second optical axis and having a field of view overlapping the first field of view and the second field of view; and an infrared illuminator configured to illuminate a region within the first field of view of the first infrared camera and the second field of view of the second infrared camera, wherein the acquisition system may be configured to control the first infrared camera, the second infrared camera, and the color camera to capture images substantially simultaneously.

The client-side device may include: a housing; a grip coupled to the housing; and the acquisition system may be housed in the housing, the acquisition system including a support bracket, a backplate coupled to the support bracket, and a plurality of electronic components between the support bracket and the backplate, and the relative positions of the plurality of electronic components may be fixed by the support bracket and the backplate.

The acquisition system may further include: a plurality of cooling fins on an outer surface of the backplate facing away from the support bracket; a plurality of cooling fins on the support bracket; and a plurality of thermal ports in the support bracket.

According to one embodiment of the present invention, a three-dimensional (3D) scanning system includes: a client-side device including: an acquisition system configured to capture images; a processing system including a processor and memory; and an interaction system including a display device and a network interface, wherein the memory of the client-side device stores instructions that, when executed by the processor of the client-side device, cause the processing system to: control the acquisition system to capture images of an object, the images being captured from a plurality of different poses of the acquisition system; compute real-time feedback from the images of the object; display the real-time feedback on the display device; and display, on the display device, a 3D mesh model generated from the images.

The memory of the client-side device may further stores instructions that, when executed by the processor of the client-side device, cause the processor of the client-side device to compute the real-time feedback by: computing a plurality of depth maps from the images; decimating the depth maps; and combining the depth maps to generate a preview point cloud, and wherein the real-time feedback includes the preview point cloud.

The memory of the client-side device may further store instructions that, when executed by the processor of the client-side device, cause the processor of the client-side device to: transmit the images of the object to an offline processing system; and receive, from offline processing system, the 3D mesh model generated from the images of the object.

The memory of the client-side device may further store instructions that, when executed by the processor of the client-side device, cause the processor of the client-side device to: compute a plurality of depth maps from the images of the objects; transmit the depth maps of the object to an offline processing system; and receive, from offline processing system, the 3D mesh model generated from the depth maps of the object.

The memory of the client-side device may further store instructions that, when executed by the processor of the client-side device, cause the processor of the client-side device to: compute a plurality of depth maps from the images of the objects; combining the depth maps to generate a combined point cloud; transmit the combined point cloud to an offline processing system; and receive, from offline processing system, the 3D mesh model generated from the combined point cloud.

The system may further include an offline processing system including a processor and memory, wherein the client-side device may be configured to distribute, in accordance with a plurality of configuration settings, a computation pipeline for computing the 3D mesh model from the images of the object between the client-side device and the offline processing system, wherein the computation pipeline may include: computing a plurality of depth maps from the images of the objects; combining the depth maps to generate a combined point cloud; and computing the 3D mesh model from the combined point cloud.

The configuration settings may be provided in a manifest file, and the configuration settings may be specified in terms of at least one of: model quality, client processing, turn-around time, client battery life, and server processing.

The model quality may include geometric detail and surface texture fidelity, the geometric detail being defined based on number of polygons in the mesh model.

The configuration settings may be dynamically configured in accordance with a plurality of current conditions of the client-side device, the current conditions including power availability and network accessibility.

The acquisition system may include: a first infrared camera having a first optical axis and a first field of view, a second infrared camera spaced apart from the first infrared camera and having a second optical axis substantially parallel to the first optical axis and a second field of view overlapping the first field of view; a color camera having an optical axis substantially parallel to the first optical axis and the second optical axis and having a field of view overlapping the first field of view and the second field of view; and an infrared illuminator configured to illuminate a region within the first field of view of the first infrared camera and the second field of view of the second infrared camera, wherein the acquisition system is configured to control the first infrared camera, the second infrared camera, and the color camera to capture images substantially simultaneously.

The client-side device may include: a housing; a grip coupled to the housing; and the acquisition system may be housed in the housing, the acquisition system including a support bracket, a backplate coupled to the support bracket, and a plurality of electronic components between the support bracket and the backplate, and the relative positions of the plurality of electronic components may be fixed by the support bracket and the backplate.

The acquisition system may further include: a plurality of cooling fins on an outer surface of the backplate facing away from the support bracket; a plurality of cooling fins on the support bracket; and a plurality of thermal ports in the support bracket.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIGS. 2A and 2B are a front view and a perspective view, respectively of a portion of a three-dimensional (3D) scanning system according to one embodiment of the present invention.

FIG. 6 includes qualitative plots illustrating the relationship between the speed of the processor chosen for the real-time processing system and the quality of the resulting model according to various embodiments of the present invention (labeled V0 through V4).

FIG. 7 depicts qualitative graphs of the relationship between the speed of the processor chosen for the real-time processing system 100 and battery life (BL) according to various embodiments of the present invention (labeled V0 through V4).

FIGS. 8A, 8B, 8C, 8D, 8E, 8F, 8G, and 8H are screenshots of a user interface according to one embodiment of the present invention, as displayed on the display device of the interaction system.

DETAILED DESCRIPTION

Figure 1:
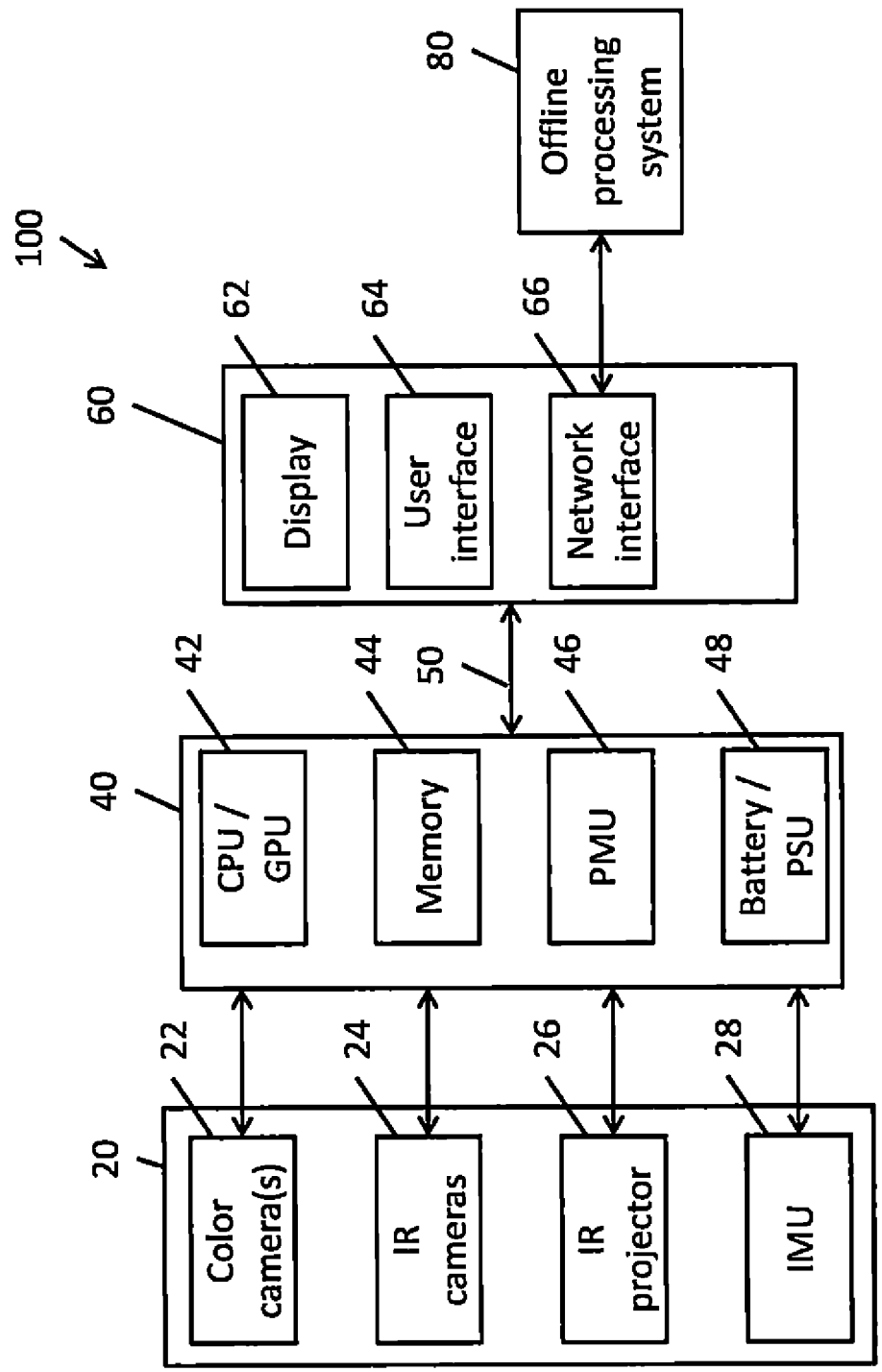
FIG. 1 is a block diagram illustrating a real-time scanning system according to one embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention relate to the field of three-dimensional (3D) scanning where a camera collects data from different views of a physical, real-world object and/or scene, then aligns and combines the data to create a 3D model of the shape and color (if available) of the object. In some contexts, the term "mapping" is also used that typically reflects the process of capturing a space in 3D. Among the camera types used for scanning, one can use an ordinary color camera, a depth (or range) camera or a combination of depth and color camera. The latter is typically called RGB-D where "RGB" stands for the red, green, and blue channels of the color image and "D" stands for the depth image (where each pixel encodes the depth or distance of that pixel between the camera and the scene). The depth image can be obtained by different methods including geometric and electronic methods. Examples of geometric methods include passive or active stereo camera systems and structured light camera systems. Examples of electronic methods to capture depth images include Time of Flight (TOF), or general scanning or fixed light detection and ranging (LIDAR) cameras.

Depending on the choice of the camera, different algorithms are used. A class of algorithms called Dense Tracking and Mapping in Real Time (DTAM) uses color clues for scanning and another class of algorithms called Simultaneous Localization and Mapping (SLAM) uses depth (or combination of depth and color) data. The scanning applications allow the user to freely move the camera around the object to capture all sides (or all visible sides) of the object. The underlying algorithm tracks the pose of the camera (e.g., with assistance from an inertial measurement unit or IMU) with respect to the object to align the captured images with the model or consequently with the partially reconstructed 3D model of the object.

Three-dimensional scanning systems such as those described in embodiments of the present invention are applicable in various circumstances where users may want to construct a 3D model of real-world objects and scenes. These applications include 3D scanning of objects for commercial uses (e.g., scanning products to generate 3D models of objects for display to shoppers in electronic commerce websites) and personal uses (e.g., generating a model of an object, such as an art project, to share with friends and family), 3D scanning for augmented reality (AR) and virtual reality (VR) placements (e.g., generating 3D models of products for shoppers to place into their homes using augmented reality techniques), scanning the architecture of buildings (e.g., to confirm that structures are being built in accordance with the designs, or to generate 3D models from physical models), advertisements, insurance (e.g., capturing additional information for assessing the state of structures and for evaluating insurance claims), industrial internet of things (IIOT), robotics (e.g., providing depth data for robot navigation and object recognition), manufacturing quality control (e.g., detecting defects in manufactured products, see, for example, U.S. Patent Application No. 62/503,115 "Manufacturing Inspection and Defect Detection with Artificial Intelligence Methods," filed in the United States Patent and Trademark Office on May 8, 2017, the entire disclosure of which is incorporated by reference herein), logistics such as warehouse capacity management (e.g., tracking and counting boxes and measuring volumes, see, e.g., U.S. patent application Ser. No. 15/445,735 "System and Method for Assisted 3D Scanning," filed in the United States Patent and Trademark Office on Feb. 28, 2017, the entire disclosure of which is incorporated by reference herein), warehouse cycle counting, and the like.

The wide range of applications of scanning systems have different requirements and tolerances in terms of, for example, user experience, network availability and latency, 3D model quality, client hardware costs, computational costs, computational speed, energy usage (e.g., battery capacity constraints and battery size and weight constraints), and the like.

As such, embodiments of the present invention encompass systems having a pipelined design that provides a set of capabilities that enable the system integrators and application designers to tailor the solution for the target application. As an example, embodiment of the present invention will be described herein with respect to a portable, handheld 3D scanning device, which may be used for scanning physical objects where the user can actively control the scanning based on feedback provided by the scanning device, while providing portability and while controlling (e.g., lowering) costs. However, embodiments of the present invention are not limited thereto, and some embodiments of the present invention may be applied in contexts such as the use of 3D scanning devices mounted on robots. For the sake of convenience, as used herein, the term "handheld" refers to a device having a size and shape that is designed to be comfortably held in a person's hands. For example, most smartphones, tablets, and personal digital assistants may be referred to as "handheld" devices, whereas laptop computers are generally not "handheld."

Performing a 3D scan of an object produces a 3D model of the object that captures the 3D geometry of the object and the appearance of its surface color and texture. The 3D model may also be referred to as a 3D mesh, where a plurality of 3D points define a plurality of polygons (e.g., triangles) representing the surface of the 3D model of the scanned object. Designing a scanning device that is both portable and easy to use may involve a number of tradeoffs, where the constraints may be set by the application. For example, in some applications, it is beneficial for the scanning device to be portable enough to be carried to the location of the object to be scanned rather than requiring the object to be transported to a scanner. Furthermore, the size, weight, and battery life of the scanning device may be a factor in determining how the scanning device can be used (e.g., how far the scanner can be transported, and what supporting equipment might be required for the scanning device to be operated). For portable scanning devices, some additional contending factors include processing capability (e.g., processor speed), memory, turn-around time for generating a 3D model, and communication resources (e.g., communication bandwidth and latency).

Therefore, some embodiments of the present invention are directed to 3D scanning systems that include a "client side" component that can be made portable, low cost, and low power, which acquires the data necessary for generating the 3D model. In some embodiments, the 3D scanning systems provide real time (or near-real time) feedback on the quality of the data collected during the scan, thereby guiding the user in acquiring additional data to improve the quality of the collected data. One example of guidance and feedback that can be provided to the user is described in U.S. patent application Ser. No. 15/445,735 "System and Method for Assisted 3D Scanning," filed in the United States Patent and Trademark Office on Feb. 28, 2017, the entire disclosure of which is incorporated by reference herein. These embodiments may be referred to as real time scanning systems. In some embodiments of the present invention, the real time scanning system includes a smartphone with an attached accessory (e.g., a depth camera attached or in communication with the smartphone). In some embodiments of the present invention, the real time scanning system includes a dedicated scanning device including a depth camera, a processor, and memory. The client side component (or real time scanning system) acquires all the data necessary for the scan, processes the acquired data in order to obtain a preview of the 3D model of the object that has being acquired, and stores some of the acquired information in order to perform some "offline" post-processing.

Once the user is satisfied with the acquired 3D model (e.g., based on a preview of the model), at least some other data that have been acquired by the real-time scanning system is transmitted to another component of the 3D scanning system, referred to herein as an "offline processing system." The offline processing system may be configured to generate a high quality 3D model of the scanned object (e.g., higher quality than the preview generated by the real time scanning system). The high quality 3D model may include, for example, more geometric detail than the preview model, though the use of more 3D points, thereby defining more polygons (e.g., triangles) that represent finer details of the shape of the surface of the object.

The term "offline processing system" as used herein refers to systems that are configured to perform post-processing of the received data. The term "offline," as used herein, is limited to the "batch" processing of the data without a strict deadline but instead generally refers to a processing system or service that is decoupled from the real-time scanning system 100 (e.g., physically separated from the real-time scanning system) and that is configured to, for example, process the data concurrently with the further capture of images by the real-time scanning system 100, and/or process the data and generate results with latency goals of, for example, seconds to minutes. Typical embodiments of offline scanning systems are processing servers (such as "local" servers directly connected to the real-time scanning system or connected to a same local area network and also including "remote" servers connected to the real-time scanning system over a wide area network such as the Internet), computer clusters, and cloud-based computing infrastructures.

In some embodiments, the preview generated by the real-time scanning system is displayed to the user during the scan to provide real-time or substantially real-time feedback and therefore may be refreshed at a high rate (e.g., several times per second), while the processing performed by the offline scanning system generally does not have such latency restrictions and, in some applications, it may be acceptable for the offline scanning system to generate a high quality model over a time of several seconds to a few minutes.

Another aspect of embodiments of the present invention relates to the user interface (UI) or user experience (UX) in the 3D scanning process. For example, some aspects of embodiments of the present invention are directed to providing real-time feedback to the user, such as in the form of a rendered point-cloud. The rendering process can also take into account surface normals of the object and color information. Another UX factor is the possibility to pause a scanning session, evaluate the current status of the scan, and resume the scanning session if the scan is not completed yet. Furthermore, in some embodiments, a multiple-session or collaborative scanning procedure allows one or multiple systems to acquire images or views of the same target at the same time or at different times, where the separate (possibly partial) scans are aggregated by the offline scanning system in a constructive fashion.

FIG. 1 is a block diagram illustrating a real-time scanning system 100 according to one embodiment of the present invention. As shown in FIG. 1, the scanning system includes an acquisition system 20, a processing system 40, and an interaction system 60. In some embodiments of the present invention, the interaction system 60 is a portable computing device such as a smartphone, a personal digital assistant (PDA), or a tablet computer. The interaction system 60 may be configured to communicate with an offline processing system 80.

According to one embodiment of the present application, the real-time scanning system includes a smartphone and an accessory connected to the smartphone via a data connection such as universal serial bus (USB) or a wireless network (or WiFi). Referring to FIG. 1, the "accessory" may correspond to the acquisition system 20 combined with the processing system 40, and the smartphone may correspond to the interaction system 60, although embodiments of the present invention are not limited thereto. For example, some embodiments, the functions of the accessory and the phone are combined to produce a single integrated device. The scanning device is configurable in the sense that different components can be integrated into, or left out of, the scanning device, depending on the requirements of the application that the device is to support. Additionally, in some embodiments, the same device can be applied in different applications, where the device is configured, through software, to fit the needs of the application (e.g., by allocating various processing operations in different processing and communication nodes, as described in more detail below).

According to one embodiment of the present invention, the acquisition system 20 includes sensing components of the real-time scanning system 100. These sensing components may include, for example, cameras 22 and 24, illuminators 26 (e.g., projection sources), and Inertial Measurement Units (IMU) 28. These sensing components acquire the data for generating the 3D models of the objects and to estimate the relative pose of the real-time scanning system 100 with respect to the object being acquired during the acquisition itself. In some embodiments, these sensing components are synchronized with each other (e.g., controlled to operate substantially simultaneously, such as within nanoseconds) and transmit the acquired information in a "streaming fashion" to the processing system 40, in order not to lose the synchronization. In one embodiment of the acquisition system, the sensing components include one or more IMUs, one or more color cameras, one or more Infra-Red (IR) cameras, and one or more IR illuminators or projectors. One example of an acquisition system is described in U.S. patent application Ser. No. 15/147,879 "Depth Perceptive Trinocular Camera System," filed in the United States Patent and Trademark Office on May 5, 2016, issued on Jun. 6, 2017 as U.S. Pat. No. 9,674,504, the entire disclosure of which is incorporated by reference. In some embodiments, rather than using at least two infrared cameras and at least one color camera, at least two RGB-IR cameras are used instead, where the RGB-IR cameras are capable of capturing both visible light (red, green, and blue channels) and infrared light (an IR channel) (see, e.g., U.S. Pat. No. 9,392,262 "System and Method for 3D Reconstruction Using Multiple Multi-Channel Cameras," issued on Jul. 12, 2016, the entire disclosure of which is incorporated herein by reference).

In addition, the illuminator (or illuminators) 26 may include a laser diode, and may also include a diffractive optical element for generating a pattern and systems for reducing laser speckle, as described in, for example: U.S. patent application Ser. No. 14/743,742 "3D Depth Sensor and Projection System and Methods of Operating Thereof," filed in the United States Patent and Trademark Office on Jun. 18, 2015, issued on Oct. 3, 2017 as U.S. Pat. No. 9,778,476; U.S. patent application Ser. No. 15/381,938 "System and Method for Speckle Reduction in Laser Projectors," filed in the United States Patent and Trademark Office on Dec. 16, 2016; and U.S. patent application Ser. No. 15/480,159 "Thin Laser Package for Optical Applications," filed in the United States Patent and Trademark Office on Apr. 5, 2017, the entire disclosures of which are incorporated by reference herein.

In the following discussion, the image acquisition system of the depth camera system may be referred to as having at least two cameras, which may be referred to as a "master" camera and one or more "slave" cameras. Generally speaking, the estimated depth or disparity maps computed from the point of view of the master camera, but any of the cameras may be used as the master camera. As used herein, terms such as master/slave, left/right, above/below, first/second, and CAM1/CAM2 are used interchangeably unless noted. In other words, any one of the cameras may be master or a slave camera, and considerations for a camera on a left side with respect to a camera on its right may also apply, by symmetry, in the other direction. In addition, while the considerations presented below may be valid for various numbers of cameras, for the sake of convenience, they will generally be described in the context of a system that includes two cameras. For example, a depth camera system may include three cameras. In such systems, two of the cameras may be invisible light (infrared) cameras and the third camera may be a visible light (e.g., a red/blue/green color camera) camera. All three cameras may be optically registered (e.g., calibrated) with respect to one another.

To detect the depth of a feature in a scene imaged by the cameras, the depth camera system determines the pixel location of the feature in each of the images captured by the cameras. The distance between the features in the two images is referred to as the disparity, which is inversely related to the distance or depth of the object. (This is the effect when comparing how much an object "shifts" when viewing the object with one eye at a time—the size of the shift depends on how far the object is from the viewer's eyes, where closer objects make a larger shift and farther objects make a smaller shift and objects in the distance may have little to no detectable shift.) Techniques for computing depth using disparity are described, for example, in R. Szeliski. "Computer Vision: Algorithms and Applications", Springer, 2010 pp. 467 et seq.

The magnitude of the disparity between the master and slave cameras depends on physical characteristics of the depth camera system, such as the pixel resolution of cameras, distance between the cameras and the fields of view of the cameras. Therefore, to generate accurate depth measurements, the depth camera system (or depth perceptive depth camera system) is calibrated based on these physical characteristics.

In some depth camera systems, the cameras may be arranged such that horizontal rows of the pixels of the image sensors of the cameras are substantially parallel. Image rectification techniques can be used to accommodate distortions to the images due to the shapes of the lenses of the cameras and variations of the orientations of the cameras.

In more detail, camera calibration information can provide information to rectify input images so that epipolar lines of the equivalent camera system are aligned with the scanlines of the rectified image. In such a case, a 3D point in the scene projects onto the same scanline index in the master and in the slave image. Let $u_m$ and $u_s$ be the coordinates on the scanline of the image of the same 3D point p in the master and slave equivalent cameras, respectively, where in each camera these coordinates refer to an axis system centered at the principal point (the intersection of the optical axis with the focal plane) and with horizontal axis parallel to the scanlines of the rectified image. The difference $u_s-u_m$ is called disparity and denoted by d; it is inversely proportional to the orthogonal distance of the 3D point with respect to the rectified cameras (that is, the length of the orthogonal projection of the point onto the optical axis of either camera).

Stereoscopic algorithms exploit this property of the disparity. These algorithms achieve 3D reconstruction by matching points (or features) detected in the left and right views, which is equivalent to estimating disparities. Block matching (BM) is a commonly used stereoscopic algorithm. Given a pixel in the master camera image, the algorithm computes the costs to match this pixel to any other pixel in the slave camera image. This cost function is defined as the dissimilarity between the image content within a small window surrounding the pixel in the master image and the pixel in the slave image. The optimal disparity at point is finally estimated as the argument of the minimum matching cost. This procedure is commonly addressed as Winner-Takes-All (WTA). These techniques are described in more detail, for example, in R. Szeliski. "Computer Vision: Algorithms and Applications", Springer, 2010. Since stereo algorithms like BM rely on appearance similarity, disparity computation becomes challenging if more than one pixel in the slave image have the same local appearance, as all of these pixels may be similar to the same pixel in the master image, resulting in ambiguous disparity estimation. A typical situation in which this may occur is when visualizing a scene with constant brightness, such as a flat wall.

Methods exist that provide additional illumination by projecting a pattern that is designed to improve or optimize the performance of block matching algorithm that can capture small 3D details such as the one described in U.S. Pat. No. 9,392,262 "System and Method for 3D Reconstruction Using Multiple Multi-Channel Cameras," issued on Jul. 12, 2016, the entire disclosure of which is incorporated herein by reference. Another approach projects a pattern that is purely used to provide a texture to the scene and particularly improve the depth estimation of texture-less regions by disambiguating portions of the scene that would otherwise appear the same.

In some embodiments of the present invention, the sensing components of the acquisition system 20 communicate with the processing system 40 using a communication bus such as Inter-Integrated Circuit (I2C) or general-purpose input/output (GPIO) connections. In some embodiments, the color camera(s) 22 and the IR cameras 24 may communicate with the acquisition system 40 using a Mobile Industry Processor Interface (MIPI) Camera Serial Interface (CSI) or Camera Serial Protocol (CSP). All these signals have the property of maintaining synchronization and to provide low-latency transfer to the processing system.

In some embodiments, the sensing components operate in a streaming fashion and may therefore have a low memory footprint. For instance, the color camera 22 may transfer the data acquired line-by-line as lines (or rows) of data are acquired, without storing the entire frame between the moment in which the acquisition is performed and the moment in which the acquired data are transferred to the processing system. Similarly, the IMU 28 may stream data regarding the current states of its accelerometers (e.g., x, y, and z direction accelerometers) to the processing system 40.

In some embodiments, the acquisition system includes at least one IR projector 26 and at least two IR cameras 24. Such a system may be referred to as an active stereo vision system, or multi-view active stereo vision system in the case in which there are more than two IR cameras. For simplicity of notation and without loss of generality, both the active stereo vision system and the multi-view active stereo vision system are also referred to as "active stereo" in this document. In the case of comparative acquisition systems encompassing a single IR camera, if there are two separate acquisition systems framing the same target (e.g., two different users), this would result in a destructive interference effect, drastically impacting the quality of the acquired geometric data. However, in the case in which the acquisition system encompasses an active stereo system, such interference effect is much less severe and, in some cases, the interference is also constructive, in the sense that illuminators from different acquisition systems framing the same target would complement each other, leading for instance to a better "lateral resolution" of the acquired depth information. Therefore active stereo systems allow the scanning device to be used in a collaborative fashion, in which multiple acquisition systems can contribute to the generation of the final three-dimensional model.

The projection source 26 according to embodiments of the present invention may be configured to emit visible light (e.g., light within the spectrum visible to humans and/or other animals) or invisible light (e.g., infrared light) toward the scene imaged by the cameras 22 and 24. In other words, the projection source may have an optical axis substantially parallel to the optical axes of the cameras 22 and 24 and may be configured to emit light in the direction of the fields of view of the cameras 22 and 24. An invisible light projection source may be better suited to for situations where the subjects are people (such as in a videoconferencing system) because invisible light would not interfere with the subject's ability to see, whereas a visible light projection source may shine uncomfortably into the subject's eyes or may undesirably affect the experience by adding patterns to the scene. Examples of systems that include invisible light projection sources are described, for example, in U.S. patent application Ser. No. 14/788,078 "Systems and Methods for Multi-Channel Imaging Based on Multiple Exposure Settings," filed in the United States Patent and Trademark Office on Jun. 30, 2015, the entire disclosure of which is herein incorporated by reference.

FIGS. 2A and 2B are a front view and a perspective view, respectively, of a portion of a three-dimensional (3D) scanning system according to one embodiment of the present invention. In the illustrated embodiment, the acquisition system 20 includes a backplate 109, a support bracket 110 coupled to the backplate 109, and a series of integrated circuit boards 111 between the backplate 109 and the support bracket 110 connected together by a series of high speed cables 112 (e.g., flex cables). The backplate 109 and the support bracket 110 each include inner surfaces 113, 114, respectively, facing the integrated circuit boards 111 and outer surfaces, 115, 116, respectively, opposite the inner surfaces 113, 114 and facing away from the inner surfaces 113, 114, respectively. The acquisition system 20 also includes a variety of sensing components configured to acquire data to perform 3D modeling of one or more objects or an environment. As noted above, in one or more embodiments, the sensing components of the acquisition system 20 include one or more inertial measurement units 28 (IMUs), one or more color cameras 22, one or more infrared (IR) cameras 24, and/or one or more IR projectors 26.

With continued reference to the embodiment illustrated in FIGS. 2A and 2B, the sensing components of the acquisition system 20 are held in fixed relative positions by the support bracket 110 and the backplate 109. In one or more embodiments, holding the sensing components 117 (e.g., the cameras) in fixed relative positions is compatible computer vision algorithms that assume that the position of the sensing components (e.g., the cameras 22 and 24) in the system are fixed relative to each other and are estimated through calibration at manufacturing time or during operation (see, e.g., U.S. patent application Ser. No. 15/147,879 "Depth Perceptive Trinocular Camera System," filed in the United States Patent and Trademark Office on May 5, 2016, issued on Jun. 6, 2017 as U.S. Pat. No. 9,674,504, the entire disclosure of which is incorporated by reference). In the illustrated embodiment, the support bracket 110 defines a series of openings 118 (e.g., holes) configured to accommodate the cameras of the acquisition system 20 (in FIG. 2A, only the opening 118 for the color camera 22 is labeled). Additionally, in the illustrated embodiment, the support bracket 110 defines a series of openings 119 configured to receive fasteners 120 securing the support bracket 110 to the backplate 109.

Because the data that are transferred by the acquisition and the processing system are generally high-speed signals, such data are propagated through a particular cable or electrical connection, there may be constraints on the spatial length of the cables or electrical connections themselves (e.g., in the case of the MIPI-CSI interface, the length of the cable carrying the electrical signal is specified to be less than 100 mm). For this reason, in some embodiments, the acquisition and the processing system are placed relatively close to each other, as constrained by the standards of the communication interfaces.

The processing system 40 receives data from the acquisition system 20 and merges the data into a "package" that contains processed data that can be communicated to the interaction system 60 via relatively low-bandwidth channels 50, such as universal serial bus (USB) or wireless networking (WiFi) channels. In some embodiments, the processing system 40 includes a processor 42. The processor 42 may include a central processing unit (CPU), which, for instance, can be either based on an Intel x86/x64 architecture, or on an ARM architecture. The processor 42 may also include a graphical processing unit (GPU), on which some types of operations (e.g., vector operations) can be off-loaded for more efficient processing. The processing system may also include memory 44, which may include persistent memory (e.g., flash memory) and dynamic memory (e.g., dynamic random access memory or DRAM). The memory 44 may store program instructions to be executed by the processor 42, and may also store data to be processed, including data received from the acquisition system 20, intermediate data, and data to be transmitted to the interaction system 60.

For example, the processing system 60 for instance can take a sequence of IR and color images from the acquisition system and compute a representation (including color and geometry) of the modeled object. The representation is stored in the memory 44 and then transferred to the interaction system 60 in order to be displayed on display device 62. Some of these operations are described in more detail below with respect to FIG. 5A.

In some embodiments, the processing unit 40 includes a Power Management Unit (PMU) 46. The PMU 46 controls the supply of power (e.g., the current and voltage) from a battery or other power supply 48 and provides to the various processing and sensing units (e.g., the processor 42, the memory 44, and the sensors of the acquisition system 20) in accordance with the individual power requirements of the components. The PMU 46 and a separate power source 48 that directly connects to the processing system 40 allows the acquisition system 20 and the processing system 40 to avoid needing to drain power from other connected devices such as the interaction system 60 (e.g., a smartphone, as described in more detail below), thereby preserving the performance of the interaction system 60 in terms of battery life and health. While the PMU 46 can be placed in the proximity of the CPU 42, in a system like the one shown in FIGS. 4A and 4B, described in more detail below, it is possible to place the battery in the handle of the system.

The output of the processing system 40 is generally a stream of data for which the temporal constraints are much looser compared to the temporal constraints on the data generated by the sensors of the acquisition system 20. For example, the output stream of the processing system 40 may include a set of snapshots of an object point-cloud, which can be displayed on the display device 62 of the interaction system 60. Given the somehow slow nature of generating a detailed 3D model of an object, which may take on the order of minutes, a latency of tens or even hundreds of milliseconds, for example, can be reasonably tolerated by the user in the visualization of such a point-cloud.

According to one embodiment of the present invention, interaction system 60 provides hardware for a user to interact with the data stream produced by the processing system 40. For example, the interaction system 60 may include a display device 62 and a user interface or user input component 64 (e.g., the display device 62 and the user input component 64 may be integrated into a touch screen device). The interaction system 60 may also include a network interface 66 (or multiple network interfaces) for transmitting and receiving data over a data network, such as to the offline processing system 80. The network interfaces may include, for example, wireless network communication interfaces (e.g., WiFi) and cellular data communication interfaces (e.g., code division multiple access or CDMA and global system for mobile communications or GSM modems) and allows for the communication of such data, optionally in a furtherly processed form (e.g., as a .zip or .tar archive) to the external world and to the offline processing system (e.g., through a TCP/IP connection). Examples of interaction systems include, but are not limited to, smartphones, personal digital assistants, tablets, and personal computers.

In various embodiments of the present invention, the real-time scanning system 100 may take on a variety of different physical shapes and configurations. For example, in one embodiment of the present invention, the acquisition system 20 may be in a module that is physically separate from the interaction system 60. One example of such a configuration is shown in U.S. patent application Ser. No. 15/382,210 "3D Scanning Apparatus Including Scanning Sensor Detachable from Screen," filed in the United States Patent and Trademark Office on Dec. 16, 2016, the entire disclosure of which is incorporated by reference herein. Separating the acquisition system 20 from the interaction system 60 affords the user with increased freedom when performing the scan, thereby allowing more convenient capture of obscured or hard-to-reach views of the object.

Thermal management can be a consideration for portable acquisition and processing systems due to their compact size. In some embodiments, a passive thermal dissipation strategy is used to reduce cost and complexity, in view of the absence of moving components such as fans, or high cost electronics such as thermos-electric Peltier devices. In one embodiment, the mechanical support structure for the acquisition system 20 is used as a heat sink.

With reference now to the embodiment illustrated in FIGS. 2A, 2B, 2C, and 2D the support bracket 110 includes a passive thermal dissipation system 121 configured to transfer heat generated by the acquisition system 20, the processing system 40, and/or the interaction system 60 from the support bracket 110 to the ambient via radiation and free convection. In the illustrated embodiment, the passive thermal dissipation system 121 includes a series of thermal ports 122 (e.g., through holes) in the support bracket 110. In the illustrated embodiment, the thermal ports 122 are aligned or substantially aligned with one or more of the electronic components in the acquisition system 20, the processing system 40, and/or the interaction system 60, such as the imaging sensors, the image processing units, and/or the active light illumination module.

Additionally, in the illustrated embodiment, the passive thermal dissipation system 121 of the support bracket 110 includes a series of thermal dissipation pads on the inner surface 114 of the support bracket 110. The thermal ports 122 extend through the thermal dissipation pads, and the thermal dissipation pads are aligned or substantially aligned with the one or more of the electronic components of the acquisition system 20. In one or more embodiments, the thermal dissipation pads contact (e.g., directly contact) designated thermal dissipation pads on the electronic components. In one or more embodiments, the thermal dissipation pads are coupled to the electronic components by a thermally conductive adhesive. The contact (e.g., direct contact or via the thermally conductive adhesive) between the thermal dissipation pads and the electronic components is configured to transfer heat generated by the electronic components to the support bracket 110 via conduction. The thermally conductive adhesive is configured to achieve a low thermal resistance in the thermal conduction pathway from the electronic components to the support bracket 110.

In the illustrated embodiment, the support bracket 110 defines a notch 124 (e.g., a cutout) exposing at least a portion of one of the integrated circuit boards 111 between the support bracket 110 and the backplate 109. Additionally, in the illustrated embodiment, the passive thermal dissipation system 121 of the support bracket 110 includes a heat sink 125 defined by a series of parallel or substantially parallel cooling fins 126. In the illustrated embodiment, the cooling fins 126 extend inward toward the backplate 109 from an edge of the notch 124. In one or more embodiments, the cooling fins 126 of the heat sink 125 are orthogonal or substantially orthogonal to the outer surface 116 of the support bracket 110. Additionally, in the illustrated embodiment, the heat sink 125 defines a platform on which one or more of the electrical components (e.g., one or more of the integrated circuit boards 111) is supported. The cooling fins 126 of the heat sink 125 are configured to transfer heat generated by the acquisition system 20, the processing system 40, and/or the interaction system 60 from the support bracket 110 to the ambient via radiation and free convection. The cooling fins 126 are configured to maximize or at least increase the surface area of the support bracket 110 that is in contact with the ambient air to facilitate heat transfer via convection. The configuration of the passive thermal dissipation system 121 of the support bracket 110 (e.g., the size, spacing, and number of cooling fins 126 and/or the size, spacing, and number of thermal dissipation ports 122 and pads) may vary, for example, depending on the number and type of electronic components in, for example, the acquisition system 20 and the processing system 40, and the amount of heat generated by these components (e.g., in accordance with the duty cycles of the components).

Figure 2D:
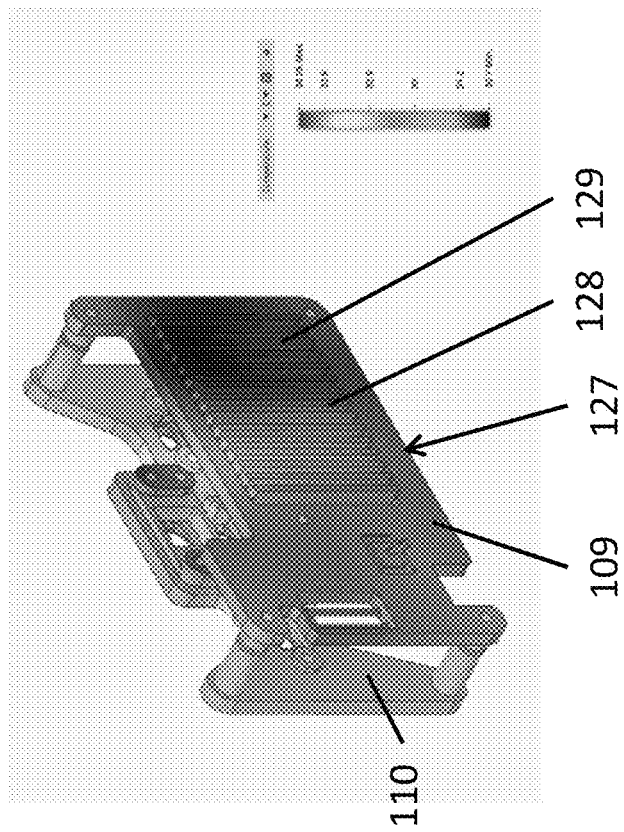
FIGS. 2C and 2D are thermal maps depicting temperature distribution on a support bracket and a backplate of the acquisition system according to one embodiment of the present disclosure.

With reference now to the embodiment illustrated in FIGS. 2B and 2D, the backplate 109 includes a passive thermal dissipation system 127. In the illustrated embodiment, the passive thermal dissipation system 127 includes a heat sink 128 defined by a series of parallel or substantially parallel cooling fins 129 on the outer surface 115 of the backplate 109. The cooling fins 129 of the heat sink 128 are configured to transfer heat generated by the acquisition system 20, the processing system 40, and/or the interaction system 60 from the backplate 109 to the ambient via radiation and free convection. The cooling fins 129 are configured to maximize or at least increase the surface area of the backplate 109 that is in contact with the ambient air to facilitate heat transfer via convection. In the illustrated embodiment, the cooling fins 129 of the heat sink 128 extend in a direction away from the support bracket 110. The configuration of the passive thermal dissipation system 127 of the backplate 109 (e.g., the size, spacing, and number of cooling fins 129) may vary, for example, depending on the number and type of electronic components in, for example, the acquisition system 20 and the processing system 40, and the amount of heat generated by these components (e.g., in accordance with the duty cycles of the components).

In one or more embodiments, the real-time scanning system 100 may include one or more active thermal dissipation devices, such as a fan or a thermoelectric cooler (e.g., a Peltier device), in addition to, or instead of, the passive thermal dissipation system 121, 127 of the support bracket 110 or the backplate 109.

Figure 2C:
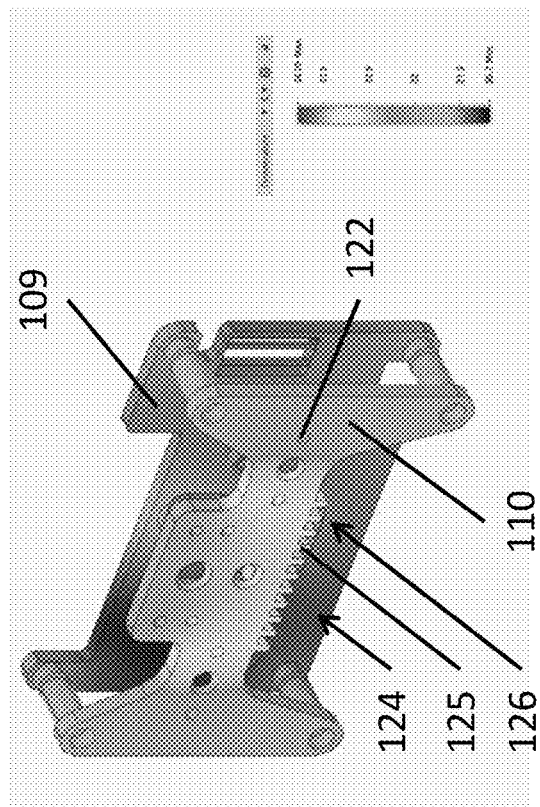

FIGS. 2C and 2D are thermal maps depicting temperature distribution on a support bracket and a backplate of the acquisition system according to one embodiment of the present disclosure. FIGS. 2C and 2D depict thermal maps of the backplate 109 and the support bracket 110 during operation of the real-time scanning system 100. The thermal maps in FIGS. 2C and 2D illustrate the efficacy of the passive thermal dissipation systems 121, 127 in transferring heat generated by the acquisition system 20, the processing system 40, and/or the interaction system 60 away from the support bracket 110 and the backplate 109, respectively.

Figure 3:
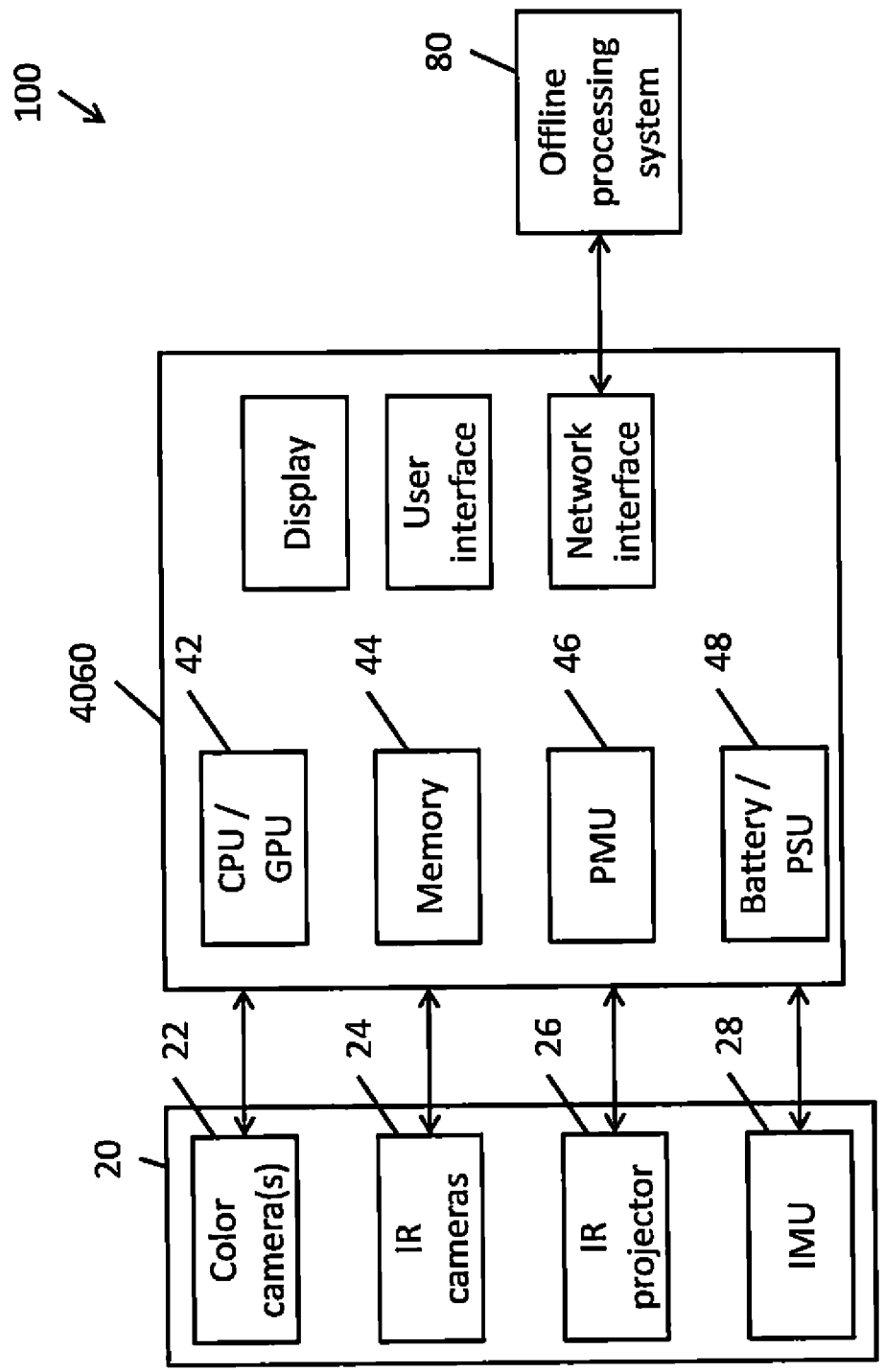
FIG. 3 is a block diagram illustrating a real-time scanning system according to one embodiment of the present invention.

FIG. 3 is a block diagram illustrating a scanning system according to another embodiment of the present invention. As shown in FIG. 3, the scanning system 10 includes an acquisition system 20 and a combined processing and interaction system 4060 (e.g., integrated into a single physical device). For example, the hardware module containing the processor 42, memory 44, PMU 46, and battery 48 may further include a touch screen 62 and a networking interface 66, such as a WiFi connection or a cellular connection, in order to provide a networking interface to the outside world and to communicate with the offline processing system 80.

Figure 4B:
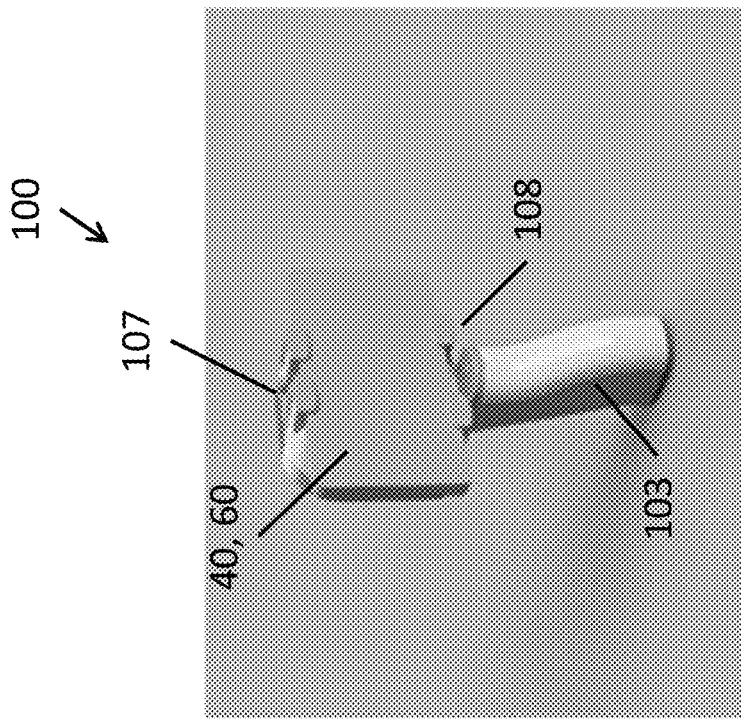
FIGS. 4A and 4B are a rear perspective view and a front perspective view, respectively, of a real-time scanning device according to one embodiment of the present disclosure.
Figure 4A:
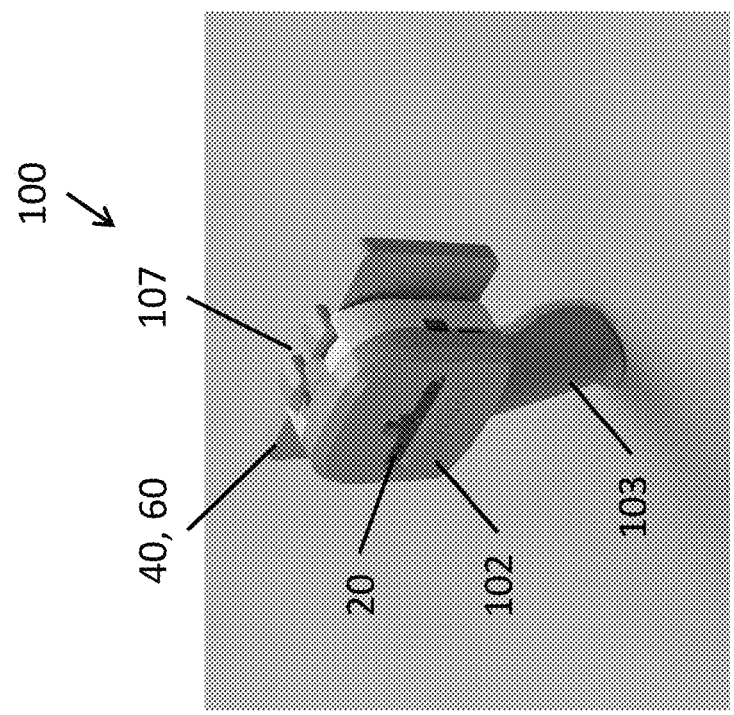

In reference to FIGS. 4A and 4B, a real-time scanning system 100 according to one embodiment of the present disclosure includes a handheld unit 101 including a housing 102, a grip 103 (e.g., a pistol grip) coupled to the housing 102 that is configured to be grasped by a user, an acquisition system 20 housed in the housing 102, and a processing system 40 and an interaction system 60 coupled to the housing 102. In one or more embodiments, the processing system 40 and the interaction system 60 may be embodied in a mobile electronic device (e.g., a mobile phone) detachably connected to the housing 102. In the illustrated embodiment, the housing 102 includes two pairs of opposing fingers 107, 108 configured to detachably support the processing system 40 and the interaction system 60 (e.g., a smartphone). The two pairs of opposing fingers 107, 108 may be adjustable (e.g., spring loaded) to accommodate mobile electronic devices of different sizes to serve as the interaction system 60. In one or more embodiments, the processing system 40 and/or the interaction system 60 may be integrated into the housing 102.

In some embodiments where a user is not actively involved in the scanning process, such as in the case of Internet of Things (IoT) or Industrial Internet of Things (IIoT) applications, interaction functionalities such as the display 62 and the user interface may be completely removed. In addition, in some such embodiments, the battery may be replaced by a different power source such as a wired power source such as Power-Over-Ethernet (POE).

As noted above, the 3D scanning system may also include an offline scanning system 80 in communication with the real-time scanning system 100 (e.g., in communication with the interaction system 60). In some embodiments of the present invention, the offline scanning system 80 is implemented as a computer system that may include a processor (which may include a general purpose processor such as a processor based on an Intel® x86/x64 architecture and which may also include a graphical processing unit or GPU) and memory. Specific examples of offline scanning systems 80 include desktop computers, laptop computers, and server computers. The offline scanning system 80 may be connected to the real-time scanning system 100 over a variety of different types of connections, including a direct connection (e.g., a universal serial bus or USB connection or an Intel® Thunderbolt® connection using, for example, a USB-C connector). In some instances, one or more server computers may be connected to the real-time scanning system 100 over a network connection. The server computer may be connected to the same local area network (LAN) as the real-time scanning system 100 (and therefore the server computer will be considered to be "local" to or "on-site" with the real-time scanning system 100) or may be connected to the real-time scanning system 100 over a wide area network (WAN) such as the Internet (and therefore the server computer will be considered to be "remote" to or "off-site" from the real-time scanning system 100).

Aspects of embodiments of the present invention are directed to generating a 3D model of an object or of an environment using a pipeline of processing stages. A pipeline of processing stages according to embodiments of the present invention enable the production of a high quality scan (e.g., a high quality 3D model) while also providing a comfortable experience for the user.

Figure 5A:
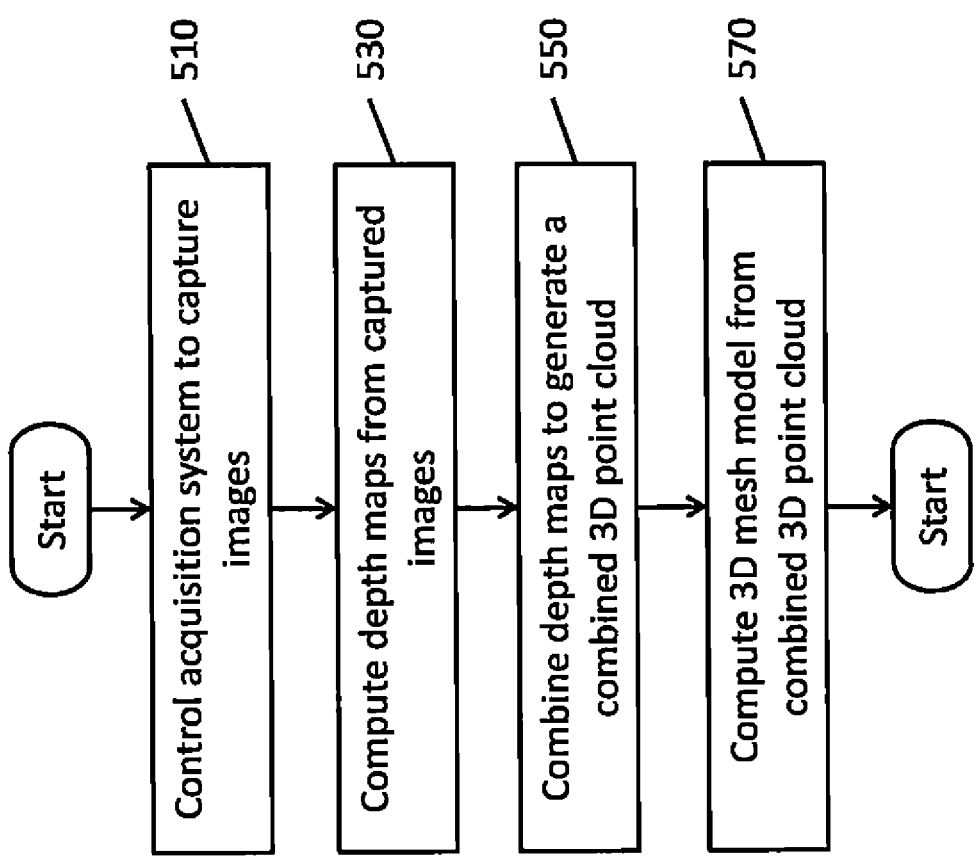
FIG. 5A is a flowchart depicting a method for capturing and generating a three-dimensional (3D) model of an object by scanning an object using a scanning system in accordance with one embodiment of the present invention.

FIG. 5A is a flowchart depicting a method 500 for capturing and generating a three-dimensional (3D) model of an object by scanning an object using a scanning system in accordance with a processing pipeline according to one embodiment of the present invention.

Referring to FIG. 5A, in operation 510, the scanning system controls the acquisition system 20 to capture images. For example, in the case of an active stereo depth camera system, the illuminator 26 may be controlled to emit infrared light while images are concurrently (e.g., substantially simultaneously) captured by the infrared cameras 24. In addition, the color camera(s) 22 may also concurrently (e.g., substantially simultaneously with the infrared cameras 24) capture a color image (or color images) from the same pose. In one embodiment, the color camera 22, the infrared cameras 24, and the illuminator 26 are rigidly attached to one another and spaced apart from each other and have substantially parallel optical axes, such that the color camera 22 and the infrared cameras 24 have overlapping fields of view and the illuminator 26 illuminates a region within the fields of view of the infrared cameras 24. Furthermore, the IMU 28 may output information regarding the physical acceleration of the acquisition system 20 (e.g., orientation of the system with respect to gravity) at the time of capture. As another example, in the case of a time-of-flight depth camera system, the acquisition system 20 may be configured to emit light and camera sensors may be configured to capture light and capture images or phases of the emitted light.

In operation 530, the scanning system computes depth images or depth maps from the images captured by the acquisition system 20. The depth images may capture different views of the object (e.g., the acquisition system 20 may have different poses, with respect to the object, as it captures images of the object, and the images captured at different poses can be used to generate depth maps of the object from the viewpoints of the different poses). For example, as noted above, in the case of an active stereo depth camera system, a feature block matching and a disparity map may be used to compute the depth map. In the case of a time-of-flight depth camera system, the time of flight of the emitted light or phases may be used to estimate the distances to objects in the scene.

In operation 550, the depth maps are combined to generate a 3D point cloud (e.g., each of the depth maps may be a point cloud that can be merged with other point clouds). Some examples of methods for merging point clouds captured from separate depth images of an object are described in U.S. patent application Ser. No. 15/630,715 "Systems and Methods for Scanning Three-Dimensional Objects," filed in the United States Patent and Trademark Office on Jun. 22, 2017, the entire disclosure of which is incorporated by reference herein.

In operation 570, a 3D mesh model is generated from the combined 3D point cloud. Generating the mesh model may also include applying texture information to the model, which may include color texture information captured by the color camera as well as bidirectional reflectance function (BRDF) information about the object. Examples of systems and methods for capturing color information and generating models based on the captured BRDF information can be found in U.S. patent application Ser. No. 15/678,075 "System and Method for Three-Dimensional Scanning and for Capturing a Bidirectional Reflectance Distribution Function," filed in the United States Patent and Trademark Office on Aug. 15, 2017, the entire disclosure of which is incorporated by reference herein.

According to some embodiments of the present invention, data (e.g., image frames) is acquired incrementally in operation 510 and expressed in reference to a fixed geometric reference frame during the scanning process. As additional data is collected (e.g., additional image frames captured with the acquisition system 20 in a different pose from the pose or poses from which previous image frames were captured), the additional data contributes to either augmenting the spatial extent of the 3D model, or to increasing the resolution and providing more detail to an existing 3D model. This approach may be termed "model-centric."

Methods such as the Iterated Closest Point (ICP) algorithm can be used to iteratively compute the position and orientation (collectively called "pose") of the acquisition system at each time and the measured 3-D location of surface points with respect to a fixed reference frame. As noted above, data from the IMU 28 may also be used to improve the calculation or estimation of the pose. The pose is expressed in terms of the camera's rotation and translation with respect to an initial pose (e.g., the pose when the first frame was captured). In some embodiments, the whole set of camera poses and 3D point clouds acquired during scanning are stored for future use.

If the camera pose is estimated correctly, then registration of the point clouds acquired at each camera position is relatively straightforward when combining the depth maps in operation 550. Therefore, the accurate computation of camera pose improves the quality of the resulting model. (Adverse factors include depth data noise and registration errors, which may result in incorrect model construction, which is noticeable in the case of incorrect "loop closure," when the reconstructed model of a compact object appears to have an artificial open seam. To deal with these situations, In one embodiment, a mechanism recognizes a missing loop closure (either automatically or with input from the user), then adjusts all the camera poses estimated during prior processing and stored as mentioned above, in such a way that the artificial open seam disappears, realizing loop closure.)

In various embodiments of the present invention, multiple methods are used, either in isolation or cooperatively, to estimate the camera pose. When 3D point clouds can be computed reliably, and the surfaces visible to the acquisition system 20 contain enough geometric variety, geometric registration using ICP can be used successfully to estimate the camera pose. Geometric registration methods define a measure of consistency of registration to assess whether two point clouds are correctly aligned. For example, methods such as ICP associate each point of a point cloud, rigidly transformed to a hypothesized pose, to the closest point in the other point cloud, and define an error based on the sum of the squared distances of associated points. Surface normals, which can be estimated from the point cloud, can also be used for this purpose (with the idea that for two well-aligned point clouds, the normal vectors at nearby points should also be aligned.)

In some embodiments, image-based structure-from-motion methods (e.g. DTAM) can be used when the image has sufficient texture (e.g., when the surface of the object has color that varies across the surface). Color information can also be used to enhance geometric registration of point clouds, because, if two points clouds are well aligned, then the surface color at nearby points in the two images should be similar. However, images of the same surface patch taken from different viewpoints may have slightly different colors due to a variety of reasons, including possibly different exposure parameters, specular reflections, and noise. Useful information about the camera pose can also be obtained from data from an inertial measurement unit (IMU) co-located with the camera. Data from the accelerometers in the IMU can be used to compute the pitch and roll angles. Gyroscopes of the IMU can be used to estimate the angular rate and thus, through time integration, the orientation of the sensor with respect to a fixed reference system. While pose estimation from IMU data is usually not accurate enough for the purpose of 3-D model building, this data can contribute to improving accuracy and robustness of geometry-based or image-based registration (e.g. as an initial pose estimation for iterative refinement).

In some situations, it is possible to have a user interface that allows pausing and resuming a scanning sessions. In a paused situation, the user is presented with a convenient representation of the point-cloud that has been acquired so far in the scanning session. This point-cloud might be manipulated by the user, allowing for a better understanding of the current state of the acquisition.

Scanning the complete surface of an object with a hand scanner may be challenging for multiple reasons. For example, scanning of a very large object requires one to scan different parts of the object and then somehow "stitch" these parts together. In another situation, the object may lie on a surface (e.g. a table top) during scanning, so that the bottom portion of the object is not visible. In this case, a second scanning may be required, after the object has been rotated to expose its lower part. In some cases, one may desire to take a second scan of an object, perhaps in order to acquire a more detailed reconstruction of some parts of the object. All of the cases mentioned above call for mechanisms designed to register together two or more possibly large point clouds ("chunks"). Differently from the case of point cloud registration from depth images collected by a camera during scanning, where the pose of the camera at a frame can be safely assumed to be close to that at the previous frame, when registering two chunks of surface data from the same object one cannot, in general, rely on prior knowledge of the camera pose. Systems and methods for chunk registration, are described in more detail in U.S. patent application Ser. No. 15/630,715 "Systems and Methods for Scanning Three-Dimensional Objects," filed in the United States Patent and Trademark Office on Jun. 22, 2017, the entire disclosure of which is incorporated by reference herein. Some aspects of embodiments of the present invention are directed to a user interface for visually aligning the point clouds, and some embodiments of the present invention are directed to user interfaces to assist in positioning the camera at the beginning of the collection of the second chunk in such a way that the surface as seen by the camera is approximately aligned to the previously collected point cloud. These are described in more detail below.

In some embodiments, this user interface is configured to provide partial scans of a single target from multiple acquisition systems, which can be placed on a rigid or on a moving structure or hand-held. In the case of the mounting of the acquisition systems on a rigid structure, in some embodiments these systems are calibrated with respect to one another (e.g., to estimate their relative positions) and to use this calibration as an initialization for the alignment of the different chunks coming from the different acquisition systems.

Along with the geometry of the object, for many applications it is useful to also acquire the "texture" of the surface, that is, its color content of the surface of the object. This is made possible by the presence of the color camera(s) 22, which is/are located in a fixed calibrated position with respect to the depth camera of the real-time scanning system. Given a color image taken of the scene, it is thus possible to "back-project" the color from a pixel to a surface element computed by the depth camera (e.g., the active stereo camera system, including the IR cameras 24 and the IR projector 26). Since the range data is eventually represented as a triangular mesh (or generally polygons), this means that each triangular facet can be "colored" with data from the color camera 22.

However, the same surface patch represented by a triangular facet may be seen by the camera in different poses during the scanning process. The multiple views of the same patch may result in images with slightly different resolution and color. It becomes thus necessary to devise a mechanism to select a view for each triangular patch, or to combine together multiple views. Multiple criteria can be used for the view selection task. For example, one could choose the view characterized by the smallest angle between the line of sight and the surface normal, or the view that is closest to the patch. One may also establish a criterion that tries to minimize visible discontinuities resulting from assigning different views to nearby patches. One reason why the same patch looks different in different views may be the presence of a specular component in the patch's reflectivity. Whereas for opaque (matte or Lambertian) surfaces the recorded color of the surface is for the most part independent of the viewing angle, when a specular component is present, the viewing angle plays an important role in the image of the patch. If specularity is neglected, one runs the risk that highlights (visible from some specific viewing directions) may end up being recorded in the object's texture. This may result in the highlights becoming visible in the rendered surface, when the object is displayed through an interactive mechanism (e.g., on a web browser), making the rendering highly unnatural. If, however, the surface patch is seen from multiple viewpoints during acquisition, one may select a view that doesn't contain highlights, thus minimizing the effect of specularity. The specular surface effect can then be introduced synthetically at rendering time. As noted above, examples of systems and methods for capturing color information and BRDF information and rendering models using the captured BRDF information can be found in U.S. patent application Ser. No. 15/678,075 "System and Method for Three-Dimensional Scanning and for Capturing a Bidirectional Reflectance Distribution Function," filed in the United States Patent and Trademark Office on Aug. 15, 2017, the entire disclosure of which is incorporated by reference herein.

The various stages of the processing pipeline shown in FIG. 5A, including the acquisition of depth data, camera pose computation, point cloud registration, and mesh creation, include tasks that require substantial computational power. Depending on the application and the usage scenario, it may be useful to offload some (or all) computation to a local or remote server, such as using a network interface 66. As such, aspects of embodiments of the present invention are directed to supporting multiple levels of "load balancing" or load distribution of the processing pipeline. For example, a portable, real-time scanning device 100 may compute, register, and store the point clouds, then send the accumulated point cloud to a server (e.g., the offline processing system 80) for mesh computation.

This, for instance, could allow some very convenient user experiences, such as pausing and resuming the acquisition, which can be very helpful in the case of large or time-consuming scans. Moreover, embodiments of the present invention allow for load-balancing across multiple acquisition systems that contribute to the scan in a collaborative fashion. Furthermore, although embodiments of the present invention are described herein primarily in the context of object scanning, embodiments of the present invention are not limited thereto and can be applied to capturing a 3D model of an environment such as a room. For instance, the point-clouds of different portions of a single room or building might be acquired by different acquisition/real-time processing systems and aggregated by a single offline processing system.

Figure 5B:
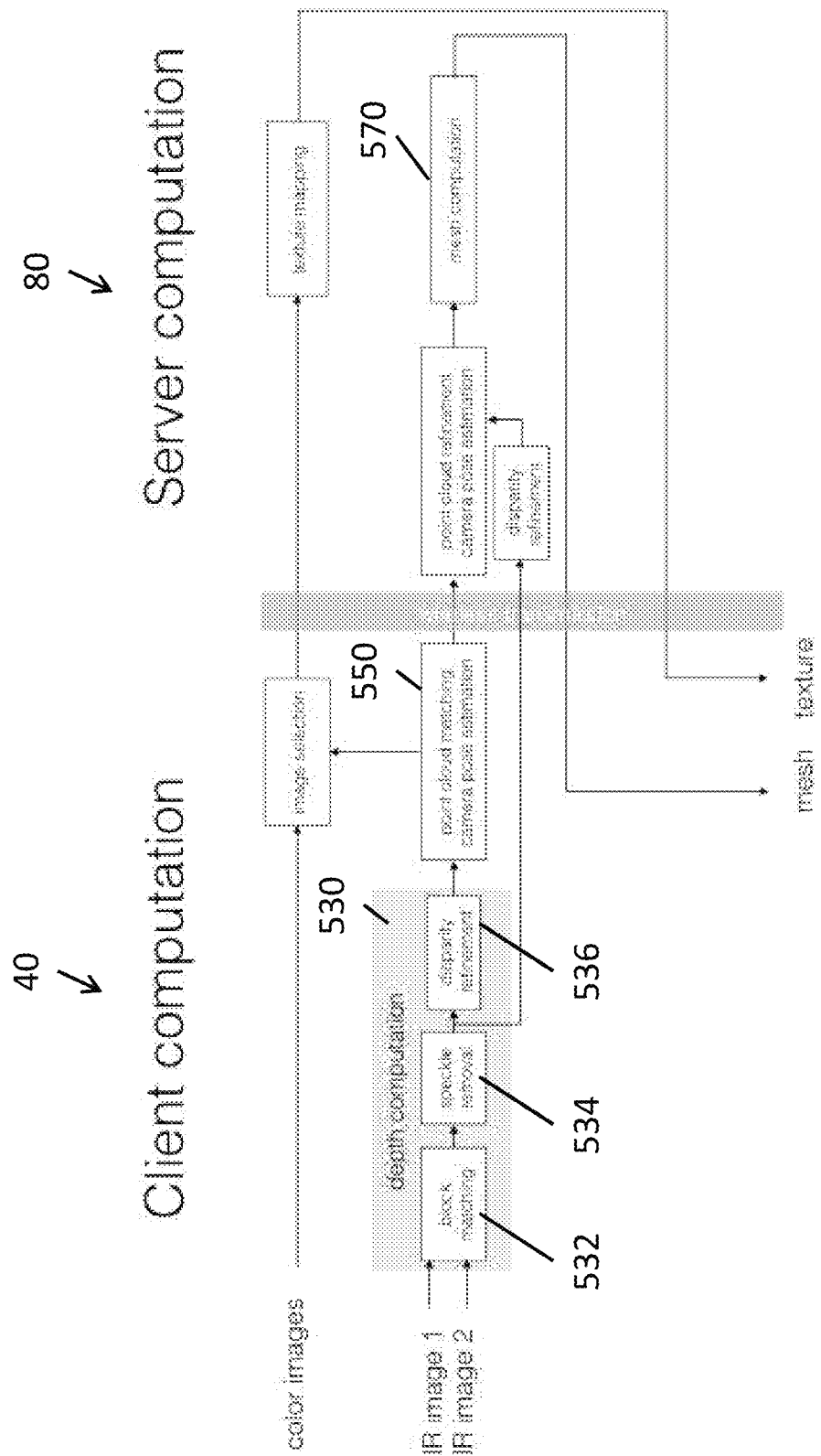
FIG. 5B is a schematic diagram illustrating one potential distribution of workload between a "client" (e.g., a portable real-time scanning system) and a "server" (e.g., the offline processing system 80) according to one embodiment of the present invention.

FIG. 5B is a schematic diagram illustrating one potential distribution of processing pipeline between a "client" (e.g., a processing system 40 of a portable real-time scanning system 100) and a "server" (e.g., the offline processing system 80) according to one embodiment of the present invention. The pipeline of embodiments of the present invention provides a set of capabilities that enable system integrators and application designers customize the cost of running applications that make use of 3D scanning. The customization may be applied both during development of a solution and the deployment of the solution. The factors that a system integrated may consider in the development stage include: the cost of material and manufacturing of hardware; and specifying the capacity of backend support systems (e.g., numbers of concurrent users supported). The deployment cost includes the cost of operating the solution in terms of using the client-side resources such as memory and battery life, and using back-end system resources such as cost of cloud computing and storage, and involving the cost of communication between both or multiple ends. These factors may also involve establishing quality constraints and user experience constraints such as the quality and accuracy of the resulting models (or the accuracy of information generated using these models), ease of use, turn-around (or response) time, and the like.

FIG. 5B depicts one possible pipeline of computation that is distributed between client (local, such as the real-time scanning system 100) and server (e.g., local or remote cloud, such as the offline processing system 80). In the embodiment shown in FIG. 5B, the processing system 40 (or client) receives color images and IR images from the acquisition system 20 as input to a depth computation pipeline implementing the depth computation 530. The depth computation pipeline may include a series of modules, including block matching 532 (e.g., identifying blocks of the images having corresponding features), speckle removal 534 (e.g., removing noise), and disparity refinement 536 (e.g., computing depth based on disparity between the IR images. In the embodiment shown in FIG. 5B, the processing system 40 also combines the depth maps to generate a 3D point cloud in operation 550 (referred to in FIG. 5B as "point cloud matching camera pose estimation"). For example, the depth data, from the depth computation pipeline 530, represented as a local point cloud, is given as input to a module that merges this local point cloud with an accumulated point cloud using ICP (e.g., performs operation 550 of FIG. 5A). Before being fed to ICP, in some embodiments, the depth data is decimated (subsampled) in order to reduce its size, thereby allowing the resource-constrained processing system 40 of the real-time scanning system to perform the ICP computation at an acceptable frame rate (e.g., to provide real-time or substantially real-time feedback). In some embodiments, this operation is performed at each new frame that is captured in operation 510. Real time ICP computation and point cloud accumulation provides a visual representation of the shape while it is acquired, which greatly facilitates the scanning operation. For example, visualization feedback allows the user to understand which parts of the object's surface have not been scanned yet, or which parts of the 3D model could be improved through further scanning of the object for better resolution. See, e.g., U.S. patent application Ser. No. 15/445,735 "System and Method for Assisted 3D Scanning," filed in the United States Patent and Trademark Office on Feb. 28, 2017, the entire disclosure of which is incorporated by reference herein In addition, the processing system 40 may select a set of color image frames captured by the color cameras 22 based on specific visibility considerations as discussed above. The selected color image frames may then be transmitted to the offline processing system 80 for texture mapping computation. Along with the color frames, their associated depth images (at full resolution) are extracted from the depth computation pipeline 530 and transmitted to the offline processing system 80. The offline processing system 80 computes a refinement of the point cloud and camera poses based on this high resolution depth data (e.g., corresponding to operation 550 of FIG. 5A); from the refined point cloud, it computes a 3D model (e.g., a mesh representation corresponding to operation 570 of FIG. 5A), as well as texture maps for the 3D model from the color images. The mesh and texture maps are sent back to the client (e.g., the interaction system 60) for display of the resulting model (e.g., on the display device 62 of the interaction system 60). The user can then decide whether the resulting 3D model is of satisfactory quality, or if more data need to be captured with a further scan. The 3D model generated by the offline processing system 80 is separate from, and generally of a higher quality than, the preview generated by the processing system 40 of the real-time scanning system 100, because the offline processing system 80 is not subject to, for example, the latency and power consumption constraints of the portable real-time scanning system 100.

The example embodiment described with respect to FIG. 5B presents some of the options and trade-offs that are come to bear when using a flexible pipeline processing system in accordance with embodiments of the present invention. A range of different design options is available, and option may affect the development and/or the deployment cost as well as quality of reconstruction (e.g., quality of the resulting 3D model) and/or the user experience (e.g., latency and/or quality of the feedback in the real-time scanning system).

For example, the use of selected high resolution depth images at the offline processing system 80 to refine the point cloud computed with depth data at low resolution represents a compromise between performing real-time computation at the client (to generate user feedback for monitoring of the point clouds being captured during scanning) and the desire for high quality 3D models. However, transmission of these depth images to the offline processing system 80 increases the load of data being transmitted, and point cloud refinement involves more computation at the offline processing system 80. One way to reduce the transmission load would to refrain from transmitting as many of the depth images; but likely reduce the quality of the resulting 3D mesh.

Other system parameters may be configured to realize different trade-offs between quality, computation, and data transmitted in accordance with the application. For example, lossy compression may be applied to the color images, where a high compression ratio reduces the amount of data exchanged, but may adversely affect the quality of the resulting texture maps.

Some embodiments of the present invention relate to configuring the level in the pipeline at which data is sent to the server for remote computation, in other words, the distribution of the workload of the computational pipeline between the portable real-time processing system 100 and the offline processing system 80. Different load balancing or load distribution strategies result in different required transmission rates, and thus trade-offs may be made between computation and transmission power in accordance with application-specific requirements.

For example, some aspects of embodiments of the present invention relate to options where the computation is spread between the real-time processing system 100 and the offline processing system 80, and where the amount of data that needs to be transmitted to an offline processing system 80 is reduced by subsampling the point cloud in such a way that detail is preserved while redundancy is eliminated. Other embodiments of the present invention delegate point cloud registration and pose estimation to the offline processing system 80. In this case, point clouds acquired at each view are transmitted. As yet another possibility, the real-time scanning system 100 may contain only the acquisition system 20 (e.g., the imaging and inertial sensors), and may be configured to transmit all images to a server through a network connection, where the server is tasked with executing the full computational pipeline (including depth computation 530, combining the point clouds 550, and computing the 3D mesh model 570), at the cost of vastly larger amount of data (e.g., all of the raw images captured by the cameras) to be transmitted. At the opposite end of the spectrum is the possibility of performing all computations locally; no transmission is needed, but this would generally involve a significantly larger memory footprint at the client, and point cloud refinement would require much more time due to the comparatively smaller computational speed of the client system. Furthermore, the power draw (e.g., the battery life) at the portable real-time scanning system 100 would be impacted.

In some embodiments of the present invention the hardware of the processing system 40 is tailored to the computation pipeline. For example, some system-on-a-chip (SoC) devices or processors enable distribution of computation across a reprogrammable hardware component (such as a field programmable gate array or FGPA) and a regular CPU (such as an Intel® x86/x64 architecture processor or ARM® architecture processor) at the cost of increased hardware materials costs. In some embodiments, the reprogrammable component in the SoC is used for the more intensive computations, such as disparity computation 532, when the data can be easily packed for serial processing without requiring substantial additional memory. The reprogrammable component can also be used as an accelerator for various software tasks assigned to the CPU. For example, when applying ICP (such as in operation 550), each point p in the accumulated cloud is projected onto the camera's focal plane at its currently estimated pose to identify the point in the local point cloud (collected by the depth camera at a certain location) that is closest to p. Given the large number of 3D points (e.g., including x, y, and z coordinates) collected during a scan, hardware execution of 3D point projection may save substantial processing time. However, random access to the values in the depth image (to associate points in the local cloud with their closest match in the accumulated cloud) would slow the whole process down if the depth image were stored in the random access memory, thereby reducing the benefit of FPGA processing. On the other hand, in some embodiments, efficient memory access is made possible by storing the depth image in the static memory of the FPGA itself, instead of in external RAM (e.g., memory 44 of the processing system 40). However, SoC devices with FPGA static memory large enough to store a full depth image can be expensive. A more economical alternative would be to subsample (decimate) the depth image to make it fit within the limited static memory of the FPGA, at the cost of possibly reducing the accuracy of pose estimation. This is one of the possible trade-offs between development cost and resulting model quality that are available in a system with a pipelined computational flow for generating 3D models according to embodiments of the present invention.

Some of the tradeoffs discussed above can be formalized as follows. A set of metrics that are impact end users include: quality/accuracy (Q), turnaround time (TT), battery life (BL), server cost (SC), and device cost (DC), which are described in more detail below.

Quality/accuracy (Q) represents both the resolution at which a shape is acquired, and the quality of the texture mapped on it. In general, higher resolution (resulting in higher modeling accuracy and thus quality of the resulting model) is a function of the number of images that are taken (possibly at close distance) of the object. Thus, acquisition and processing of a larger amount of data generally results in higher accuracy models than models of the same object constructed with less data. For the same number of images acquired during a scan, more accurate texture rendering can be achieved by using a larger number of color images in the texture mapping process. This relationship, however, is not linear: the increase in texture quality becomes negligible after a large enough number of color images has been captured.

Turnaround time (TT) represents the time required by the system from the moment data acquisition ends (e.g., the moment after operation 510 in FIG. 5A) to the moment a final result is produced that can be visually evaluated by the user. (Note that the interaction system 60 may still display the model being formed in real time.) In some applications, it is useful if the user can quickly examine the final 3D model computed by the system (e.g., the mesh), in order to decide whether the current result is satisfactory, or if more scanning is needed of the same object to improve the quality of the result. In various embodiments of the present invention, the operations 530, 550, and 570 of FIG. 5A may be performed either locally by the real-time processing system 100 and/or by the offline processing system 80. In some embodiments, these operations are performed while the user is still scanning the object. The turnaround time TT thus accounts for the time needed to transmit the data to the offline processing system, to process this data at the offline processing system 80 (including mesh and texture generation), and to transmit the result back to the real-time processing system 100.

In the some of the embodiments of the present invention, described above, the real-time processing system 100 is a portable (or untethered) system that is battery powered. In such circumstances, the battery life (BL) metric reflects the time that the real-time scanning system can operate under battery power, given the energy needs of the components of the portable real-time scanning system 100. (For a tethered device, e.g., a device that draws power from an electrical outlet during operation, this parameter will not apply as a constraint.) The battery life (i.e., the time it takes for the battery to become fully depleted under the current task) is an important measure of usability of the system. For example, in applications where multiple scans are performed on a single charge, long battery life may be an important constraint.

Server cost (SC) in embodiments of the present invention where the offline processing system 80 is a server, there may be costs associated with running such a server, which is typically much faster than a client device, and has access to more communication and memory resources. For example, in the case where the server is a remote cloud server, the cloud service may charge an hourly fee for use of the server, which ultimately will be incurred by the user. In the case where the server is a local server, there may be costs associated in acquiring and maintaining the hardware.

Device cost (DC) of the real-time scanning system 100 may depend on the hardware chosen for the device, and also affects the performance that should be expected of the device. For example, high performance processors and specialized SoC devices may be more expensive. As another example, adding more memory to the system will also increase the device cost.

In some embodiments, the quality of the feedback provided to the user (e.g., the preview quality) is also a metric or factor in the design. For example, in some applications, a higher quality preview model may be used to provide user with real time feedback on the quality of the fine details of the object captured during the scan, while in other applications, high quality real-time feedback may not be necessary (e.g., when scanning to capture general shapes of objects). As another example, the latency or the frame rate of the feedback may be more important in some applications than others. Accordingly, higher quality feedback generally imposes higher processing demands on the real-time scanning system 100 and therefore may require a faster processor and/or increased power consumption and therefore the system may be customized in accordance with the feedback quality expectations or requirements of the application.

The above metrics may have different levels of relevance in different applications. For example, in some applications, high quality acquisition may be important, and, in those applications, a relatively high price for cloud processing may be acceptable, provided that fast turnaround can be achieved. Other applications may involve acquiring many repeated scans of simple objects; accordingly, in these applications, long battery life may be more important, while fast turnaround time may be less important. In still other applications, the users may be interested in a single high-quality scan, but not be willing to pay for cloud processing. Occasional users may be looking for an inexpensive device to reduce up-front costs, and may be willing to incur higher per-use cost for cloud processing for sporadic high quality model production.

The overall computational load assigned to the distributed system (e.g., the combination of the real-time scanning system 100 and the offline processing system 80) may be expressed in terms of a computational unit metric. The number of computational units of a software module could be defined, for example, by the execution time of that software module by a standardized, "canonical" machine. Faster machines will be able to execute the same software in shorter time. As used herein, the term processing speed $\pi$ of a machine is defined as the inverse of the time required by this machine to execute a software module with complexity equal to one computational unit (or, equivalently, the ratio of the time taken by a "canonical" machine to complete a certain task to the time taken by the considered machine to complete the same task.) Thus, a machine with processing speed of $\pi$ is able to execute a software module with a computational cost of C computational units in $C/\pi$ time. If computation is distributed between a client and a remote server computer, the total computational cost C can be, in first approximation, split into $C_c$ (computational cost at client) and $C_s$ (computational cost at server), with $C_c+C_s \approx C$. Note that the processing speed $\pi_s$ of the server is normally larger (typically by a factor of 3 to 10) than the processing speed $\pi_c$ of the client computer. The processing speed of the server (e.g., the offline processing system 80) also depends on the type of architecture considered. Use of a GPU architecture (when appropriate) may increase $\pi_s$ and thus reduce the computational cost $C_s$ for a given task.

In some embodiments of the present invention, the client-server structure involves the transmission of data in output from the client to the server and, potentially, the transmission of 3D models from the server to the client. In some circumstances, in order to increase the portability of the real-time scanning system 100, the transmission of data is performed wirelessly (e.g., using a WiFi connection or a cellular data connection), while in other embodiments, the transmission may be performed over a wired connection (e.g., an Ethernet connection). In the example of FIG. 5B, the transmitted data would include the accumulated point cloud, selected color images, and the associated depth images. In another embodiment, the entire image sequence from a stereo camera (e.g., the cameras 22 and 24) may be transmitted to the server; and in another embodiment, the transmitted data includes the individual point clouds before registration along with the accumulated point cloud. The amount of data to be transmitted for a particular task will be indicated by the variable D. In some embodiments, the values of D for an object scan performed using the system shown in FIG. 5B may be in the range of 30 to 50 megabytes (mostly accounted by color and depth image data).

As discussed above, long scans with many images may generally result in higher quality models. The size of the accumulated point cloud grows with the number of images. Consequently, when generating a 3D model using an offline processing system 80, to achieve a higher value of quality (Q) a larger amount of data D needs to be transmitted to the offline processing system 80. In addition, increasing the number of color images transmitted may (up to some point) increase the quality of texture mapping. A larger number of acquired images results in a proportional increase in the computational cost $C_c$ at the client, as well as a super-linear increase of server cost $C_s$.

The battery life (BL) of the client device (e.g., the real-time scanning system 100) performing a certain sequence of identical tasks will be defined in terms of the number of such tasks that can be executed before the battery is depleted (assuming that the battery was fully charged at the beginning of the process). The battery life is inversely proportional to the energy required to complete the task. This energy can be considered to be a function of the computational cost $C_c$ of the client's task, as well as of the amount of data D to be transmitted (as communication consumes, generally, an amount of energy that is proportional to the amount of data D being transmitted). Therefore, the battery life BL associated with a certain task is inversely proportional to a function of $C_c$ and D:

$$BL=1/(\alpha \cdot C_c + \beta \cdot D)$$

where coefficients $\alpha$ and $\beta$ represent computational power consumption and transmission power per data unit, respectively. For example, $\alpha$ may be smaller for newer generation processors (e.g., due to smaller transistors and lower power requirements) and $\beta$ may vary based on current network conditions (such as wireless signal strength or high network packet loss, thereby requiring retransmission of data).

The turnaround time TT can be approximated as the sum of the latency of data transmission to/back from the server and of the processing time $C_s/\pi_s$ at the server. The latency of data transmission can be modeled as a function of D with coefficient $\gamma$ (where $\gamma$ represents the average bit rate). Hence, the turnaround time TT can be modeled as:

$$TT=C_s/\pi_s + \gamma \cdot D$$

As a general rule, tasks that require more computational resources (higher $C_s$) will result in higher server costs SC. Typically, when a certain average usage pattern can be expected, one may reserve a certain amount of resources in advance, and pay a fixed fee. When usage (measured in terms of the computational cost $C_s$ over a certain period of time, as well as of the data transmitted and received) exceeds the allotted amount, a peak rate is charged for the exceeding usage. As noted earlier, use of a GPU at the server may reduce the time required to complete a task, but a server that includes a GPU is generally more expensive. As such, the resulting server cost savings, may be offset by the typically higher cost associated with use of a more powerful machine, depending on the particular pricing circumstances and the relative efficiencies of the algorithms as run on a GPU versus a CPU and based on the workload of the system.

When balancing the computational load between client and server, the above expressions may be used to select parameters to configure a system according to embodiments of the present invention according to the expected requirements of the user for the particular application. For example, the configuration may specify which initial stages are to be performed by the client (e.g., the real-time scanning system 100) and which by the server (e.g., the offline processing system 80). This can be mapped into a distribution of the overall computational cost over client ($C_c$) and server ($C_s$) costs, which also affects the amount of data D=f($C_s$) to be transmitted. Various configurations can be evaluated in accordance with the system parameters introduced above (computational speed $\pi_c$, $\pi_s$; power $\alpha$ dissipated per computational unit at the client; transmission power $\beta$ per data unit; transmission bit rate $\gamma$; server usage cost per computational unit $\delta$).

As examples of the trade-offs between the measures of interest described above, several different embodiments of the present invention, labeled V1-V4, are presented below along with the embodiment shown in FIG. 5B (indicated as V0). The amount of data transmitted for a typical object scan using this baseline configuration is indicated as $D_0$; the computational cost at the client and at the server in this case are $C_{c0}$ and $C_{s0}$.

V1: In this configuration, all computation (including mesh formation of operation 570) is performed at the client. No data is transmitted (therefore $D_1$=0), and the computational load for the whole pipeline is assigned to the client computer ($C_{c1}=C_{c0}+C_{s0}>>C_{c0}$).

V2: This configuration is similar to the baseline, except that there is no transmission of high-resolution depth images to the server. This results in smaller amount of data transmitted ($D_2<D_0$), while the computational cost at the client remains the same ($C_{c2}=C_{c0}$).

V3: In this case, all high-resolution depth images are sent to the server, which is in charge of ICP computation (to register individual point clouds). The computational load at the client is reduced ($C_{c3}<C_{c0}$), but more data needs to be transmitted ($D_3>D_0$).

V4: This configuration delegates all computation (including depth computation) to the server ($C_{c4}$=0). This requires transmitting all acquired images ($D_4>D_0$).

FIG. 6 depicts qualitative graphs of the relationship between the speed of the processor chosen for the real-time processing system 100 and the quality of the resulting model according to various embodiments of the present invention (labeled V0 through V4). Note that faster computers are normally more expensive than slower machines, and thus the client computer speed directly affects the cost of the device (DC). FIG. 7 depicts qualitative graphs of the relationship between the speed of the processor chosen for the real-time processing system 100 and battery life (BL) according to various embodiments of the present invention (labeled V0 through V4). As discussed earlier, the battery life can be modeled as $BL=1/(\alpha \cdot C_c + \beta \cdot D)$, where $\alpha$, the power dissipated per computational unit at the client, is usually an increasing function of the computer speed. Typically, the price of a processor increases linearly with its processing speed.

In the baseline embodiment V0 (e.g., the embodiment illustrated in FIG. 5B), a minimum processor speed is necessary for the system to be able to compute depth and register point clouds via ICP at an acceptable frame rate (note that a certain degree of overlap between point clouds is necessary for reliable registration, meaning that the frame rate must be sufficiently high to account for the motion of the scanner between frames). For processor speeds above this threshold, depth images with increasingly high resolution can be computed and processed with ICP, resulting in better models. The maximum quality is achieved at a large enough processing speed, and is limited by the resolution of the cameras used for depth computation. The battery life $BL_0$ decreases with the computer speed; it is bounded from above by the term $1/\beta \cdot D_0$, which represents the energy cost of data transmission.

In embodiment V1, where all computation is performed at the client, a much higher processor speed is necessary to obtain even low quality images; a powerful processor is needed to obtain a satisfactory model (as indicated by the horizontal line). There is no data transmitted, and thus the battery life only depends on the processor speed: $BL_1 = 1/(\alpha \cdot C_{c1})$. Since $C_{c1} \gg C_{c0}$, it should be expected that, at the speed necessary for a sufficient quality model, the battery life will be much worse than $BL_0$, thereby requiring use of a larger capacity power supply, or suggesting that these embodiments would be better suited in applications where the real-time scanning system can be plugged-in to a large battery or an electrical outlet.

Embodiment V2 can reach a model quality equivalent to the baseline V0 only by using a more powerful processor at the real-time processing system 100, which makes up for the missing the processing of high resolution depth images at the server. Its battery life may be better than for the baseline V0, because less data is transmitted to the server.

Embodiments V3 and V4 result in higher quality models being produced even with less powerful processors at the real-time processing system 100, because the bulk of the processing is delegated to the server (especially in the case of V4, in which case the client only needs to transmit data to the server, receive the resulting mesh and texture, and display the model to the user). However, both embodiments V3 and V4 involve transmission of high amounts of data D to the server. While data transmission is the dominant factor in the power consumed for V4 (usage of the processor 42 of V4 is minimal), variation V3 assumes that the depth computation, which requires substantial processing, is still performed at the client.

Table. 1 shows how the different performance parameters discussed above compared with the baseline embodiment V0, for a particular choice of processor at the client (and thus fixed client device cost DC). The speed of this client is marked by a vertical dashed line in FIGS. 6 and 7. The symbols ↑ (↑↑) or ↓ (↓↓) indicate (large) increase or decrease in the corresponding parameter. The symbol - indicates no variation.

TABLE 1

|    | Quality (Q) | Turnaround time (TT) | Battery life (BL) | Server cost (SC) |
|----|-------------|----------------------|-------------------|------------------|
| V1 | ↓↓          | ↑↑                   | ↓↓                | N/A              |
| V2 | ↓           | —                    | ↑                 | ↓                |
| V3 | ↑           | —                    | ↓                 | ↑                |
| V4 | ↑           | —                    | ↑                 | ↑↑               |

As such, in various embodiments of the present invention, the computational pipeline for generating 3D models of an object from images captured of the object can be distributed between a local processing system 40 and an offline processing system 80. Various trade-offs may be made in accordance with the distribution of this workload, although the embodiments of the present invention share the same underlying processing pipeline.

In these various embodiments of the present invention, the capacity of the battery 48 may be sized in accordance with the power requirements of the real-time scanning system 100. For example, in embodiments of the present invention where less of the processing pipeline is performed by the real-time scanning system 100 and more of the processing is offloaded to the offline processing system 80, the battery 48 may have a smaller capacity, thereby reducing weight and improving portability. On the other hand, in embodiments where more of the processing pipeline is performed by the real-time scanning system 100, then the battery 48 may have a larger capacity in order to provide the energy to power the local computations.

Similarly, in embodiments of the invention where the structural support for the acquisition system 40 includes heat sinks, the heat sinks 125 and 128 and/or their respective cooling fins 126 and 129 may be sized in accordance with the heat generation characteristics of the electrical components of the acquisition system 40, including the processor 42 and the memory 44. In a manner similar to that described above with respect to the battery, in embodiments of the present invention where less of the processing pipeline is performed by the real-time scanning system 100 and more of the processing is offloaded to the offline processing system 80, the heat sinks 125 and 128 can be smaller because less heat is generated by the electronic components, thereby reducing weight and improving portability. On the other hand, in embodiments where more of the processing pipeline is performed by the real-time scanning system 100, then the heat sinks 125 and 128 may be larger in order to provide sufficient heat dissipation to cool the processor 42 and memory 44 to standard operating temperatures.

In some embodiments of the present invention, the pipelined computation is configured through the use of configuration settings provided to the client device (e.g., the real-time scanning system 100). In some embodiments, the configuration is specified based on an explicit setting of which stages of the pipeline are performed by the client device (e.g., the processing system 40 of the real-time scanning system 100) and which stages are performed by the server device (e.g., the offline processing system 80). Accordingly, in these embodiments, the client device controls which portions of the pipeline are performed locally (e.g., by the processing system 40) and which portions of the pipeline are performed remotely (e.g., by the offline processing system 80) by selectively performing some portions of the pipeline locally and selectively transmitting the data for further processing by the offline processing system 80.

In some embodiments, these configuration settings are set by a configuration file (e.g., a manifest file) that is provided by a system developer when configuring a real-time scanning system for deployment in an environment to support a particular application. By including these configuration settings in a separate configuration file, the same software package can be deployed for use in different applications and configured for the particular requirements of the application. Furthermore, in such embodiments, the same software package can be deployed on different hardware (e.g., hardware having different processor speeds) and the configuration file may be used to control which portions of the pipeline are processed locally, based on the system developer's knowledge of what hardware will be available in the real-time scanning system 100. For example, the configuration may specify performing fewer stages of the pipeline in cases where the processor 42 is slow or where weight constraints have resulted in the choice of smaller heat sinks 125 and 128 for dissipating heat generated by the processor 42. As another example, the configuration may specify performing more stages of the pipeline in cases where the processor 42 is fast or where weight constraints have allowed for larger heat sinks 125 and 128 to dissipate more heat from the processor 42 and thereby allow the processor 42 to perform more demanding computational tasks.

In some embodiments of the present invention, the configuration is specified in terms of application-specific goals (e.g., the particular application of the scanning system, such as in warehouse logistics, personal home scanning, model generation for retail use, and the like). These application goals may include at least one of model quality, preview quality, client processing, turn-around time, client battery life, and server processing (e.g., the factors described above).

For example, a configuration file may include a ranking of importance of these factors or may assign relative weights to the importance of these factors. Based on these configuration settings of the various factors, the real-time scanning system 100 automatically selects a particular configuration (e.g., one of the embodiments V0, V1, V2, V3, and V4) that satisfies or best fits the application goals specified in the file.

In some embodiments, the configuration settings are manually set by the user through a user interface provided by the interaction system 60. In a similar way, these settings may also be controlled using a ranking or a weighting of various goals, such as through a drag and drop list for ordering the goals, or through sliders for setting the weights of the goals.

In still other embodiments of the present invention, the configuration settings may be dynamically adjusted in accordance with current conditions of the real-time scanning system, such as power availability (e.g., battery operation versus plugged-in operation, battery charge level), network accessibility (e.g., network connection strength, network communication power requirements, network availability), user preferences (e.g., current goals and system requirements), in accordance with, for example, the relationships between model quality (Q), feedback quality (or preview quality), battery life (BL), client and server computational costs ($C_c$ and $C_s$), data transmission (D), turnaround time (TT), client and server processing speed ($\pi_c$ and $\pi_s$), server cost (Sc and $\delta$), client computational and network power usage ($\alpha$ and $\beta$), transmission bit rate ($\gamma$).

For example, qualitatively, when the real-time scanning system 100 is connected to an external power source, the real-time scanning system 100 may automatically configure itself to perform more stages of the computational pipeline locally or generate higher quality preview models in order to provide better feedback to the user. However, when the real-time scanning system 100 is operating on battery power, it may configure itself perform fewer operations locally in order to conserve battery life. As another example, when the network connection strength is strong, the real-time scanning system 100 may transmit full resolution depth data and high quality texture data to the server system to obtain higher quality models. On the other hand, when the network connection strength is weak, the network interface may require additional power (e.g., due to the need to transmit signals at a higher power for the data to be received by the base station and/or due to retransmission of data in cases of high packet loss), then the real-time scanning system 100 may configure itself to perform more operations locally and to transmit more highly compressed data to the server, to transmit reduced data to the server (e.g., the combined point cloud after operation 550), or perform the entire computational pipeline locally (e.g., including 3D mesh generation).

As noted above, aspects of the present invention are directed to improving the user experience (UX) of performing a scan using a scanning system according to embodiments of the present invention. There are several factors that affect the experience of using a three-dimensional scanner. In addition to the acquisition system, the real-time and the offline processing systems, and the load-balancing techniques described above, the user interface (UI) and the ergonomics of the system itself also affect the user experience.

Three-dimensional scanning can be a time-consuming process and can be subject to errors both by the 3D scanning algorithm and user errors. As such, one aspect of embodiments of the present invention relates to systems and methods for providing real-time (or substantially real-time) feedback to the user during a scanning process. A user interface according to one embodiment of the present invention provides interfaces for a user to receive quick and intuitive feedback on the current status of the scan, allow the user to easily manipulate views of the preview scan and views of the 3D model, and provide the user with guidance on how to improve the quality of the scan.

Furthermore, aspects of embodiments of the present invention are directed to providing increased flexibility to improve user ergonomics. For example, embodiments of the present invention are robust (within a range tailored to the application domain) to changes in distance from the object, thereby allowing the user to stand at a comfortable distance from the target, while also allowing a user to manually zoom in and out (or move closer and farther from the object) to get more detail, as needed. In particular, in some embodiments, the distance between the infrared cameras 24 is set based on the expected range of distances at which the target object is expected to be located from the scanning sensors. Furthermore, as noted above, some embodiments of the present invention are directed to scanning devices that are lightweight and portable, thereby allowing a user to easily move around the object and to scan all sides of an object. In addition, some embodiments of the present invention allow the repositioning of the object in order to scan previously hidden surfaces of the object.

FIGS. 8A, 8B, 8C, 8D, 8E, 8F, 8G, and 8H are screenshots of a user interface according to one embodiment of the present invention, as displayed on the display device 62 of the interaction system 60.

Figure 8A:
Figure 8B:
Figure 8C:
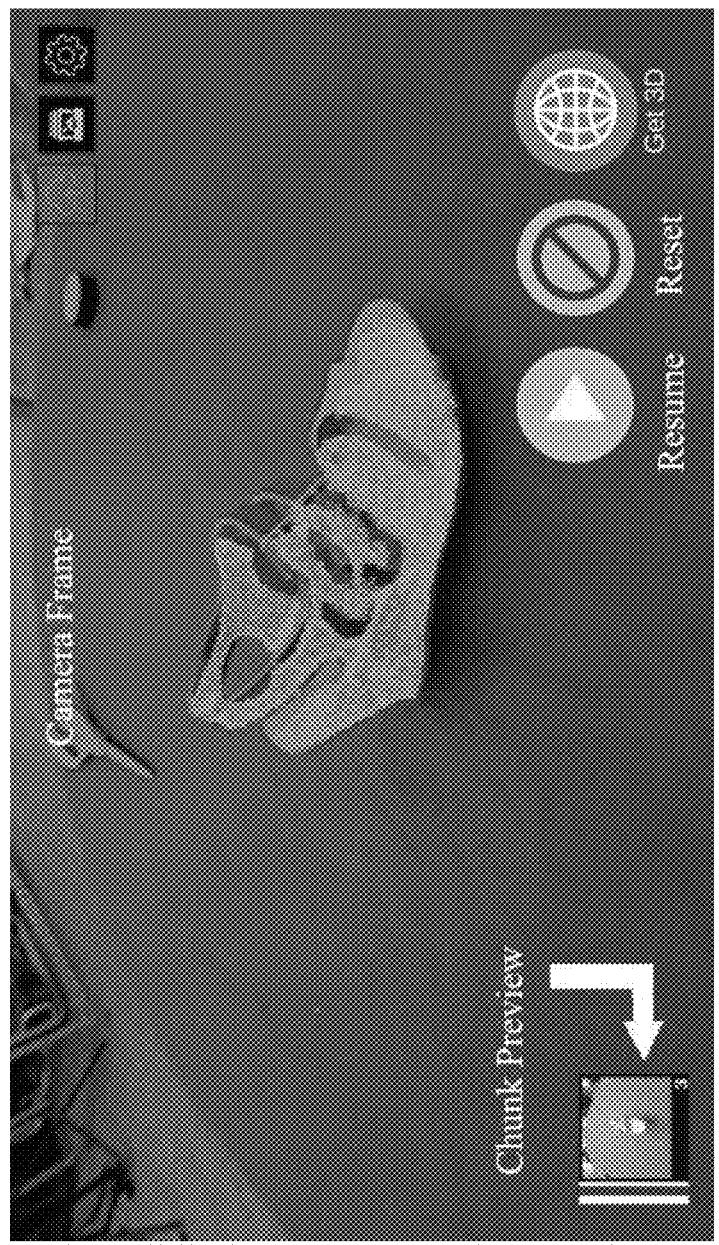

FIGS. 8A, 8B, and 8C are screenshots depicting user interfaces displayed on the display device 62 of the interaction system 60 while the real-time scanning system is in "scan mode," according to one embodiment of the present invention. In one embodiment, while in scan mode, the user interface shown on the display device 62 of the interaction system is configured to show a live view of the current view from the color camera 22. The user interface may also show the current point cloud if the user would like to resume. The point cloud is constituted by a set of three-dimensional points which can be visualized in the two-dimensional frame of the user interface by applying rendering techniques which account for occlusions, normal, and the orientation of the current image acquired by the color camera with respect to the point cloud itself.

The user interface may also show the current status of the scan, by displaying the combined point cloud that has been acquired so far during the scan (e.g., a "preview" or low fidelity version of the point cloud that is computed by the processing system 40 using decimated depth images), which is rendered in real-time or substantially real-time and overlaid on the real-time view from the color camera 22 that is shown on the screen. This high speed, potentially low fidelity feedback provides the user with information about the current progress of the scan, such as which portions of the object have been successfully scanned, and regions where the scan may have captured incorrect information about the shape of the object.

As noted above, embodiments of the present invention allow the user to move the camera around to capture the object from different angles and to move the camera towards and away from the model for various levels of detail. The position of the preview of the combined point cloud can be kept aligned with the object in the color image by tracking the pose of the acquisition system 20 through ICP and IMU data, as described above.

As shown in FIG. 8A, in one embodiment of the present invention, successful scan is shown by applying a blue frame highlight to the user interface. In addition, as shown in FIG. 8A, the user is able to pause the scan (e.g., temporarily stop capturing infrared frames and generating depth maps) by pressing the "pause" button. In some embodiments, a "chunk preview" drawer provides a preview of previous chunks that have been scanned, which can provide feedback about the completeness of the scan. Such chunks previews can be represented by the first color frame collected during the chunk acquisition or a rendering of the chunk point cloud or mesh, by taking into account geometry, color, and normals information.

FIG. 8B provides an example of a failure to scan, as represented by a red highlight or frame around the user interface. The feedback regarding the scanning failure can shorten the length of time required to perform scans by allowing the user to quickly take remedial action (e.g., correcting the alignment of the point cloud with the current orientation of the object or re-scanning poorly captured surfaces of the object).

FIG. 8C provides an example of user interface in which the user has paused the scan. The user can correct the alignment of the point cloud by providing user input (e.g., through the user input interface 64 of the interaction system) to align the point cloud to a new location. If the point cloud is properly aligned, then the scan can continue. If not, then a new chunk may be started. Examples of methods and user interfaces for capturing, assigning, and assembling chunks captured from separate scans of an object are described in U.S. patent application Ser. No. 15/630,715 "Systems and Methods for Scanning Three-Dimensional Objects," filed in the United States Patent and Trademark Office on Jun. 22, 2017, the entire disclosure of which is incorporated by reference herein.

Figure 8D:
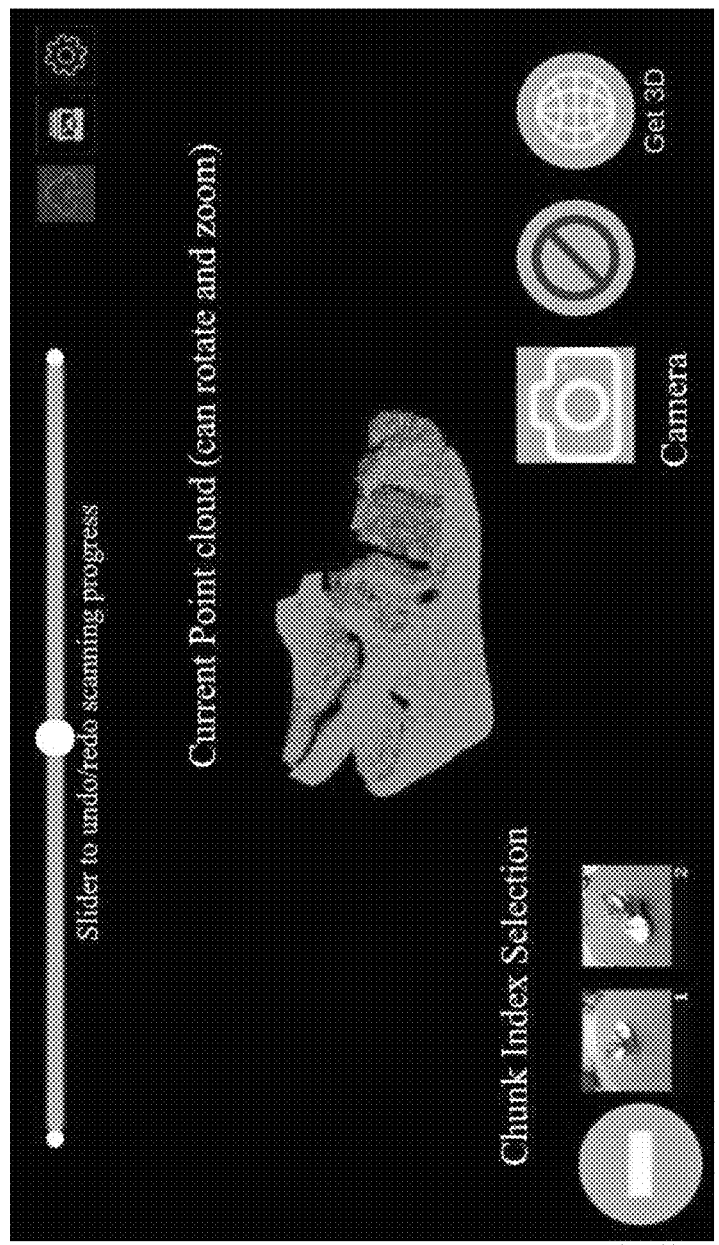
Figure 8E:

FIGS. 8D and 8E are screenshots depicting user interfaces displayed on the display device 62 of the interaction system 60 while the real-time scanning system is in "review mode," according to one embodiment of the present invention. According to one embodiment of the present invention, the review mode user interface displays the current point cloud created from the scan. In this review mode, the user may rotate and zoom in and out of the current scan. In addition, the user may identify parts of the point cloud that are low quality and may resume the scan to capture additional data for those low quality portions (e.g., returning to the "scan mode" describe above with respect to FIGS. 8A, 8B, and 8C).

FIG. 8D depicts a current scanned point cloud, which can be rotated and zoomed in and out to allow the user to explore the preview of the scan. A slider bar at the top of the user interface acts as a timeline "scrubber" that allows the user to "roll back" or undo various portions of the scan in order to recover from, for example, scanning errors. The user can also scrub forward through the scanning process to see the incremental contributions provided by each portion of the scanning process thus far. Furthermore, a selection of previously captured chunks may be shown in a "chunk drawer," which allows a user to see which portions of the current 3D model were contributed by the separate chunks and to manage the chunks (e.g., delete chunks, replace chunks, or add more chunks). A camera button allows the user to resume scanning (e.g., return to scan mode), and a "get 3D" button can be used to trigger the creation and display of a 3D model (e.g., retrieving the 3D model from the offline processing system 80, which may create the 3D model after being sent the data from the real-time processing system 100 or by creating the 3D model locally on the real-time processing system 100).

FIG. 8E is a screenshot of a user interface displayed on the display device 62 for previewing individual chunks according to one embodiment of the present invention. As shown in FIG. 8E, multiple chunks are shown along the bottom of the user interface, and one of the chunks is selected. The 3D point cloud of the selected chunk is displayed in the main area of the user interface and is depicted as also including the color information captured by the color camera 22 during the capture of the chunk. A "save" button allows the user to save particular chunks for later use. In addition, a "cloud status" button shows the current status of the model generation process at the offline processing system 80. A "view" button can be used to access a view of the current 3D mesh, as generated from the images captured during the scan.

Figure 8F:
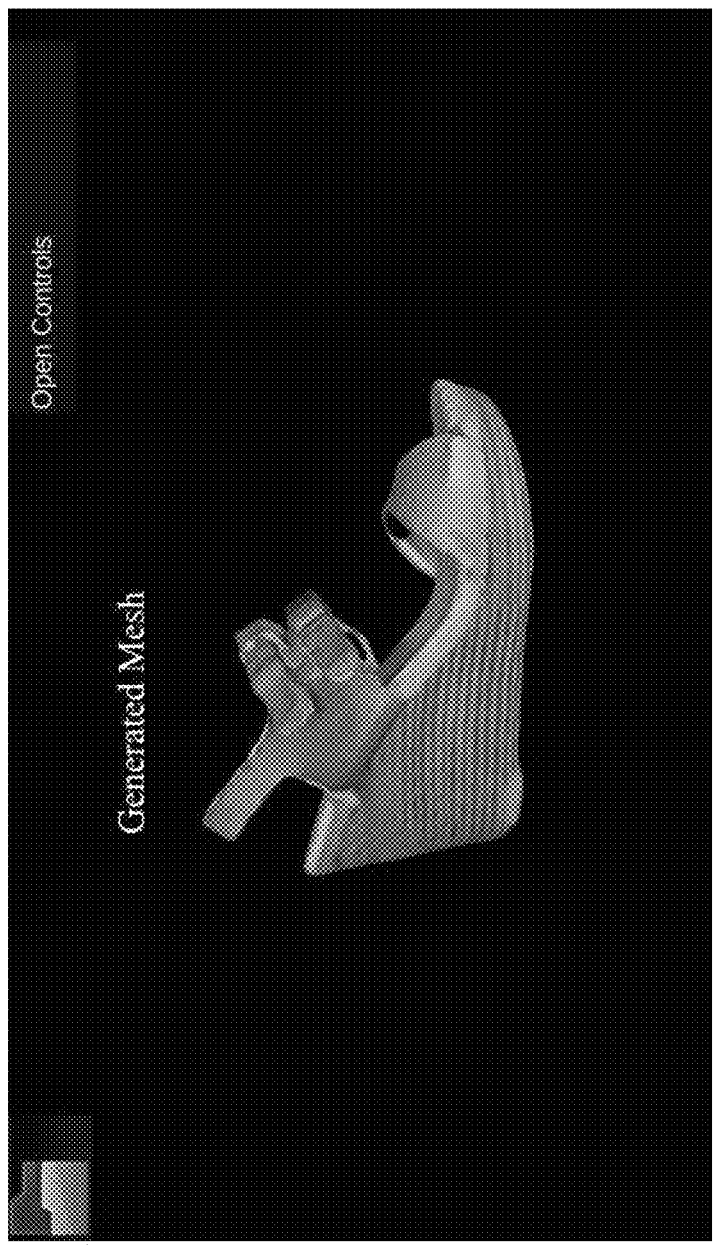
Figure 8G:
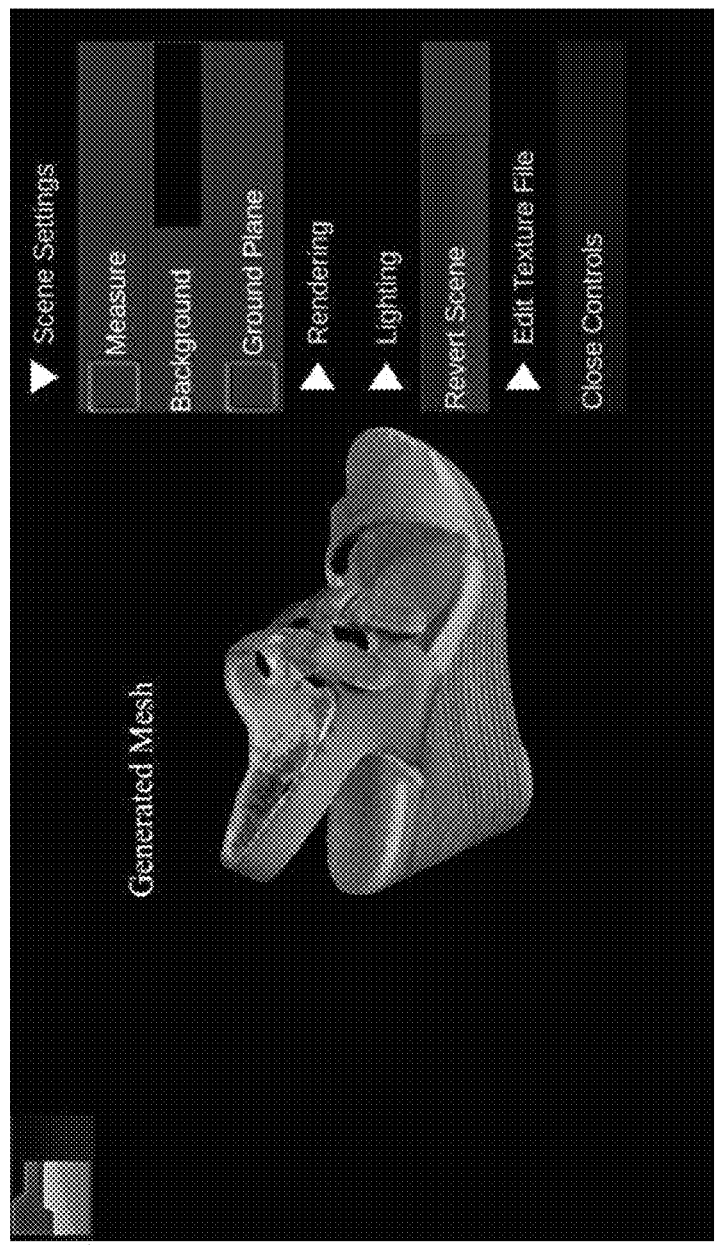

FIGS. 8F, 8G, and 8H screenshots depicting user interfaces displayed on the display device 62 of the interaction system 60 while the real-time scanning system is in "model review mode," according to one embodiment of the present invention. In the model review mode, the user interface may display the 3D model of the object created from the scan. In this interface, the user can rotate and zoom in/out of the 3D model. In addition, the user can add different lighting scenarios to view the 3D model of the object under different conditions. The rendering of the model may be implemented using a 3D rendering engine. FIG. 8F shows a screenshot of user interface for viewing the final, texture mapped 3D mesh generated in accordance with an embodiment of the present invention. As with other views, the user is able to rotate and zoom in and out on the model to inspect the model. In model review mode, a button is available to access a library of other meshes (e.g., previously scanned objects) and a button is available to display advanced mesh controls.

FIG. 8G is a screenshot of a user interface with the advanced mesh controls displayed. The advanced controls include a tool for measuring lengths within the models, inserting a ground plane, modifying rendering and lighting conditions, and editing the texture file (e.g., replacing the texture files or editing the bitmap of the texture files).

FIG. 8H is a screenshot of a user interface for comparing the scanned point cloud against a reference model. In the left side of the user interface, a yellow box is drawn around a region with missing data. On the right side of the user interface, a similar yellow box is drawn around a region of the reference model corresponding to the region where the data was missing in the scanned model. This allows the system to provide feedback to the user regarding locations where the scan may have been incomplete.

The model comparison embodiment described above with respect to FIG. 8 may be applied in an industrial setting in order to compare a scanned object with a reference design. For example, such a comparison tool may be used to not only find holes and missing pieces indicating structural differences between the scanned object and the reference model, but can also be able to do texture analysis to determine aesthetic differences (e.g., defects in the surface materials of the scanned object, see, e.g., U.S. Patent Application No. 62/503,115 "Manufacturing Inspection and Defect Detection with Artificial Intelligence Methods," filed in the United States Patent and Trademark Office on May 8, 2017, the entire disclosure of which is incorporated by reference herein). The comparison tool can also analyze the material of the object in order to provide additional data to the user. The comparison tool can point out symmetry of an object which may provide further insight to the user about the object that is being scanned. Lastly, the comparison can be used for a variety of logistics applications such as warehouse capacity management, warehouse cycle counting, and the like.

This disclosure describes a system for automatic detection and classification of different classes of defects on manufactured parts made of non-rigid, pliable material. The system works on the 3-D texturized model of the object as acquired by, for example, a single range camera at a fixed location, by a single range camera that is moved to scan the object, or by an array of range cameras placed around the object. (The process of acquiring the 3-D surface of an object by whichever means will be called "3-D scanning" in the following.) In one possible embodiment of this system, the nominal (model) surface of the object is made available, for example in the form of a CAD model. In another embodiment, one or more undefective object units are made available; these units can be 3-D scanned, allowing the system to learn the characteristics of the object's nominal surface. In addition, the system is provided with a number of defective units of the same object, in which the nature of each defect is clearly specified. The defective samples are 3-D scanned; the resulting surface models could be processed to extract "descriptors" that help the system to automatically discriminate between defective and non-defective parts. Optionally, rather than directly detecting a defect, the system can use these descriptors to detect relevant "features" of the part under exam. For example, it could identify individual folds or wrinkles of the surface, or a zipper line, or the junction between a handle and a panel. Defects could be defined based on these features, as in the examples mentioned earlier (e.g., by counting the number of detected wrinkles within a certain area and/or by measuring their length.)

In some embodiments of the present invention, a "descriptor" in the form of a vector of numbers, is used to represent the entire surface, or a portion thereof. This descriptor is extracted automatically by a machine learning algorithm such as a convolutional neural network (CNN), as described later in this section. This descriptor characterizes the most representative features of the surface, and could be used for multiple purposes. For example, it could be given in input to a binary classifier, which could determine the presence or absence of a defect. It could be used to compute a value of discrepancy with respect to the original surface, where "discrepancy" is defined in relation to the morphological characteristics that are telling of the possibly presence of a defect. It could also be employed to detect relevant features of the surface, such as folds, gaps, or zipper lines, which can then be used to detect a defect using formal rules involving the morphology of such features.

As mentioned earlier, a CNN is normally composed by a set of convolutional layers, followed by one or more fully connected layers. The final output could be a vector with dimensionality equal to the number of classes considered; the value of the n-th entry of this vector could represent the probability that the input data belongs to the n-th class. A CNN could also be "decapitated" by removing the fully connected layers; the vector in output from the convolutional layers can be used as a descriptor vector for the applications mentioned above. For example, descriptor vectors thus obtained could be used to compare different surfaces, by computing the distance between such vectors. As another example, the descriptor vector from the convolutional layers of a CNN could be used to "segment" the input data to identify specific areas of interest (e.g., the presence of a set of wrinkles on the surface) through the use a Fully Convolutional Network, or FCN.

CNNs are most commonly used to analyze images (2-D arrays). Their use for 3-D data has also been proposed in the literature. One simple situation is that of a "depth image", as returned by a range camera. A depth image is an image whose value at each pixel represents the distance of the closest surface along the line of sight identified by the pixel. Depth images can be processed directly using a CNN. More complex situations call for data representation that can be handled by a CNN. For example, a 3-D surface could be encoded via a volumetric representation, which can be then processed by a specially designed CNN. General CNNs operating on 2-D images can still be used if the 3-D data is pre-processed so as to be represented by a set of 2-D images. One option is to synthetically generate a number of views of the surface as seen by different virtual cameras placed at specific locations and at specific orientations. For example, the cameras could be placed on the surface of a sphere around the object, oriented towards a common point in space. Each virtual camera generates an image, under specific assumptions about the reflectivity properties of the object's surface, as well as on the scene illuminant. As an example, one could assume that the surface has Lambertian (matte) reflection characteristics, and that it is illuminated by a point source located at a specific point in space. The collection of the images thus generated forms a characteristic description of the surface, and enables processing using algorithms that take 2-D data (images) in input. To increase the representational power of this multi-view descriptor, multiple images from the same virtual viewpoint could be considered, obtained by varying the location of the point illumination source; increasing the angle formed by the surface normal and the incident light may enhance small surface details while at the same time generating cast shadows. One could also add other spatial information as supplementary "channels" in this representation. For each virtual view, each pixel could contain a vector of data comprising, for example, the image value, the depth of the surface seen by the pixel, and its normal. These multi-channel images can then be fed to a regular CNN. Various options are available to integrate data from the multiple images obtained of the 3-D surface from different viewpoints. For example, the method in processes all individual images with an identical convolutional architecture; data from these parallel branches is then integrated using a max-pooling module, obtaining an individual descriptor vector that is representative of the surface being analyzed.

The computational module that produces a descriptor vector from a 3-D surface is characterized by a number of parameters. For example, in the case of a CNN, the computational module is composed by a cascade of "layers", each containing a number of parallel convolutions (filters), each followed by a non-linearity and possibly a data reduction step ("data pooling"). In this case, the parameters may include the number of layers, the coefficients of the filters, the distribution of pooling layers, etc. Proper parameter assignment is key to producing a descriptor vector that can effectively characterize the relevant and discriminative features enabling accurate defect detection. A machine learning system such as a CNN "learns" some of these parameters from the analysis of properly labeled input "training" data.

The parameters of the system are typically learnt by processing a large number of input data vectors, where the real ("ground truth") class label of each input data vector is known. For example, the system could be presented with a number of 3-D scans of undefective items, as well as of defective items. The system could also be informed of which 3-D scan corresponds to a defective or undefective item, and possibly of the defect type. Optionally, the system could be provided with the location of a defect. For example, given a 3-D point cloud representation of the object surface, the points corresponding to a defective area could be marked with an appropriate label.

Some aspects of embodiments of the present invention are directed to methods for applying a scanning system in logistics operations that would benefit from assisted or guided scanning. In one application, a large stack of packed boxes on a pallet or on warehouse shelves are scanned in order to obtain a 3D representation of the pallet or shelves and used to estimate the configuration of the packed boxes, which can then be used for obtaining an accurate count of the number of boxes in the stack and therefore estimate information such as current inventory, missing boxes, misplaced boxes, and the like.

For example, in one embodiment, a warehouse employee may walk up to a shelf and use a scanning system to perform a quick scan of the shelf, which contains an assortment of boxes. The result of the scan is automatically analyzed to quickly see the current inventory or box count and to determine information about missing boxes or misplaced items (e.g., discrepancies between information about the shelf in an inventory database and the result of the scan). A typical warehouse employee may perform several hundred to several thousand such scans every day, and therefore embodiments of the present invention using guided or assisted scanning provide a scanning system that is fast, responsive, reliable, and easy to use for warehouse employees who may receive limited training on the scanning system. The guidance provided by the scanning system helps to provide an accurate reconstruction of the pile of boxes and also maximal coverage in order to be able to efficiently process this data and to obtain accurate inventory information.

The scanned data can also be stored for future retrieval. Having detailed scans of products easily accessible by different departments can let a retailer retrieve the exact specifications of any product from the warehouse. This can allow business to refine their procedures or production process in order to reduce product returns.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A three-dimensional (3D) scanning system comprising a plurality of acquisition systems configured to capture images, each acquisition system comprising:
    a depth camera;
    a processor and memory; and
    a network interface,
    the memory of each of the acquisition systems storing instructions that, when executed by the processor, cause the corresponding acquisition system to:
        control the depth camera of the corresponding acquisition system to capture a plurality of images of one or more objects, the plurality of acquisition systems capturing images concurrently and from different poses with respect to the one or more objects;
        compute a partial 3D model of a portion of the one or more objects based on the images captured by the corresponding acquisition system; and
        transmit the partial 3D model of the portion of the one or more objects to an offline processing system via the network interface.

2. The 3D scanning system of claim 1, wherein the depth camera of each acquisition system comprises:
    a first infrared camera having a first optical axis and a first field of view,
    a second infrared camera spaced apart from the first infrared camera and having a second optical axis substantially parallel to the first optical axis and a second field of view overlapping the first field of view;
    a color camera having an optical axis substantially parallel to the first optical axis and the second optical axis and having a field of view overlapping the first field of view and the second field of view; and
    an infrared illuminator configured to illuminate a region within the first field of view of the first infrared camera and the second field of view of the second infrared camera,
    wherein the acquisition system is configured to control the first infrared camera, the second infrared camera, and the color camera to capture images substantially simultaneously.

3. The 3D scanning system of claim 1, wherein the offline processing system comprises:
    a processor and memory; and
    a network interface,
    the memory storing instructions that, when executed by the processor, cause the processor to:
        receive the partial 3D models from the plurality of acquisition systems via the network interface of the offline processing system;
        combine the partial 3D models generated by the acquisition systems having different poses with respect to the one or more objects to generate a combined 3D model of an object of the one or more objects;
        detect one or more defects in the object based on the combined 3D model of the object; and
        store a report of the detected one or more defects in association with the object.

4. The 3D scanning system of claim 3, wherein the memory of the offline processing system further stores instructions that, when executed by the processor, cause the processor to detect the one or more defects in the object based on the combined 3D model by:
    comparing the combined 3D model to a reference model; and
    identifying portions of the combined 3D model that differ from the reference model as the one or more defects in the object.

5. The 3D scanning system of claim 3, wherein the memory of the offline processing system further stores instructions that, when executed by the processor, cause the processor to detect the one or more defects in the object based on the combined 3D model by:
    synthesizing a plurality of two dimensional views of the object; and
    classifying the two dimensional views of the object using a convolutional neural network trained to detect defects based on a plurality of training data comprising 3D models of defective and undefective objects.

6. The 3D scanning system of claim 1, wherein the offline processing system comprises:
a processor and memory; and
a network interface,
the memory storing instructions that, when executed by the processor, cause the processor to:
receive the partial 3D models from the plurality of acquisition systems via the network interface of the offline processing system;
combine the partial 3D models generated by the acquisition systems having different poses with respect to the one or more objects to generate a combined 3D model of an object of the one or more objects;
recognize the object to compute a classification; and
store the classification of the object.

7. The 3D scanning system of claim 1, wherein the offline processing system comprises:
a processor and memory; and
a network interface,
the memory storing instructions that, when executed by the processor, cause the processor to:
receive the partial 3D models from the plurality of acquisition systems via the network interface of the offline processing system;
combine the partial 3D models generated by the acquisition systems having different poses with respect to the one or more objects to generate a combined 3D model;
estimate a volume of the one or more objects; and
store the estimated volume of the one or more objects.

8. The 3D scanning system of claim 1, wherein the offline processing system comprises:
a processor and memory; and
a network interface,
the memory storing instructions that, when executed by the processor, cause the processor to:
receive the partial 3D models from the plurality of acquisition systems via the network interface of the offline processing system;
combine the partial 3D models generated by the acquisition systems having different poses with respect to the one or more objects to generate a combined 3D model;
count the number of the one or more objects; and
store the number of the one or more objects.

9. A three-dimensional (3D) scanning system comprising:
a handheld 3D scanning device comprising:
a depth camera; and
a processor and memory,
the memory storing instructions that, when executed by the processor, cause the processor to:
control the depth camera to capture a plurality of images of one or more objects;
compute a 3D model of the one or more objects; and
compute an estimated volume of the one or more objects based on the 3D model.

10. The 3D scanning system of claim 9, wherein the handheld 3D scanning device further comprises a network interface,
wherein the memory further stores instructions that, when executed by the processor, cause the processor to transmit the estimated volume to an offline processing system of the 3D scanning system via the network interface, and
wherein the offline processing system is configured to store the estimated volume of the one or more objects.

11. The 3D scanning system of claim 10, wherein the handheld 3D scanning device further comprises a display device, and
wherein the memory further stores instructions that, when executed by the processor, cause the processor to display the estimated volume on the display device.

12. The 3D scanning system of claim 9, wherein the memory further stores instructions that, when executed by the processor, cause the processor to:
count the number of the one or more objects in the 3D model; and
store the number of the one or more objects.

13. The 3D scanning system of claim 12, wherein the handheld 3D scanning device further comprises a network interface,
wherein the memory further stores instructions that, when executed by the processor, cause the processor to transmit the number of the one or more objects to an offline processing system of the 3D scanning system via the network interface, and
wherein the offline processing system is configured to store the number of the one or more objects.

14. The 3D scanning system of claim 9, wherein the depth camera comprises:
a first infrared camera having a first optical axis and a first field of view,
a second infrared camera spaced apart from the first infrared camera and having a second optical axis substantially parallel to the first optical axis and a second field of view overlapping the first field of view;
a color camera having an optical axis substantially parallel to the first optical axis and the second optical axis and having a field of view overlapping the first field of view and the second field of view; and
an infrared illuminator configured to illuminate a region within the first field of view of the first infrared camera and the second field of view of the second infrared camera,
wherein depth camera is configured to control the first infrared camera, the second infrared camera, and the color camera to capture images substantially simultaneously.

15. A method for three-dimensional (3D) scanning by a handheld 3D scanning device comprising: a depth camera; and a processor and memory, the method comprising
controlling, by the processor in accordance with instructions stored in the memory, the depth camera to capture a plurality of images of one or more objects;
computing, by the processor, a 3D model of the one or more objects; and
computing, by the processor, an estimated volume of the one or more objects based on the 3D model.

16. The method of claim 15, wherein the handheld 3D scanning device further comprises a network interface,
wherein the method further comprises transmitting the estimated volume to an offline processing system via the network interface, and
wherein the offline processing system is configured to store the estimated volume of the one or more objects.

17. The method of claim 16, wherein the handheld 3D scanning device further comprises a display device, and
wherein the method further comprises displaying the estimated volume on the display device.

18. The method of claim 15, wherein the method further comprises:

counting, by the processor, the number of the one or more objects based on the 3D model; and storing, by the processor, in the memory, the number of the one or more objects.

19. The method of claim 18, wherein the handheld 3D scanning device further comprises a network interface, wherein the method further comprises transmitting the number of the one or more objects to an offline processing system via the network interface, and wherein the offline processing system is configured to store the number of the one or more objects.

20. The method of claim 15, wherein the depth camera comprises:

a first infrared camera having a first optical axis and a first field of view, a second infrared camera spaced apart from the first infrared camera and having a second optical axis substantially parallel to the first optical axis and a second field of view overlapping the first field of view;

a color camera having an optical axis substantially parallel to the first optical axis and the second optical axis and having a field of view overlapping the first field of view and the second field of view; and an infrared illuminator configured to illuminate a region within the first field of view of the first infrared camera and the second field of view of the second infrared camera, wherein depth camera is configured to control the first infrared camera, the second infrared camera, and the color camera to capture images substantially simultaneously.

* * * * *